US008569160B2

(12) United States Patent
Rinerson et al.

(10) Patent No.: US 8,569,160 B2
(45) Date of Patent: *Oct. 29, 2013

(54) DEVICE FABRICATION

(71) Applicants: Darrell Rinerson, Cupertino, CA (US);
Robin Cheung, Cupertino, CA (US)

(72) Inventors: Darrell Rinerson, Cupertino, CA (US);
Robin Cheung, Cupertino, CA (US)

(73) Assignee: Unity Semiconductor Corporation,
Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/665,603

(22) Filed: Oct. 31, 2012

(65) Prior Publication Data
US 2013/0059436 A1    Mar. 7, 2013

Related U.S. Application Data

(62) Division of application No. 12/454,322, filed on May 15, 2009, now Pat. No. 8,314,024.

(60) Provisional application No. 61/203,192, filed on Dec. 19, 2008, provisional application No. 61/203,163, filed on Dec. 19, 2008, provisional application No. 61/203,187, filed on Dec. 19, 2008.

(51) Int. Cl.
*H01L 21/768* (2006.01)
(52) U.S. Cl.
USPC .................................. 438/598; 257/E21.575
(58) Field of Classification Search
None
See application file for complete search history.

(56) References Cited

U.S. PATENT DOCUMENTS

| | | | |
|---|---|---|---|
| 5,789,320 | A | 8/1998 | Andricacos et al. |
| 5,835,396 | A | 11/1998 | Zhang |
| 6,034,882 | A | 3/2000 | Johnson et al. |
| 6,128,214 | A | 10/2000 | Kuekes et al. |
| 6,458,621 | B1 | 10/2002 | Beck |
| 6,580,120 | B2 | 6/2003 | Haspeslagh |
| 6,656,785 | B2 | 12/2003 | Chiang et al. |
| 6,753,561 | B1 | 6/2004 | Rinerson et al. |
| 6,765,245 | B2 | 7/2004 | Bansal |
| 6,788,576 | B2 | 9/2004 | Roizin |
| 6,855,647 | B2 | 2/2005 | Beck et al. |
| 6,965,137 | B2 | 11/2005 | Kinney et al. |
| 7,068,533 | B2 | 6/2006 | Ferrant et al. |

(Continued)

OTHER PUBLICATIONS

Kurjanowicz, Wlodek, "Evaluating Embedded Non-Volatile Memory for 65nm and Beyond," DesignCon 2008, Feb. 4, 2008. 23 pages.

(Continued)

*Primary Examiner* — Seahvosh Nikmanesh
(74) *Attorney, Agent, or Firm* — Stolowitz Ford Cowger LLP

(57) ABSTRACT

Device fabrication is disclosed, including forming a first part of a device at a first fabrication facility as part of a front-end-of-the-line (FEOL) process, the first part of the device comprising a base wafer formed by FEOL processing, and subsequently performing one or more back-end-of-the-line (BEOL) processes at a second fabrication facility to form an IC, the one or more BEOL processes comprising finishing the forming of the device (e.g., an IC including memory) by depositing one or more memory layers on the base wafer. FEOL processing can be used to form active circuitry die (e.g., CMOS circuitry on a Si wafer) and BEOL processing can be used to form on top of each active circuitry die, one or more layers of cross-point memory arrays formed by thin film processing technologies that may or may not be compatible with or identical to some or all of the FEOL processes.

25 Claims, 16 Drawing Sheets

(56) References Cited

U.S. PATENT DOCUMENTS

| | | | |
|---|---|---|---|
| 7,212,432 | B2 | 5/2007 | Ferrant et al. |
| 7,218,984 | B1 | 5/2007 | Bayat et al. |
| 7,235,454 | B2 | 6/2007 | Kim et al. |
| 7,257,458 | B1 | 8/2007 | Markle |
| 7,271,063 | B2 | 9/2007 | Chung-Zen |
| 7,335,575 | B2 | 2/2008 | Hsu et al. |
| 7,337,149 | B2 | 2/2008 | Blouin et al. |
| 7,381,981 | B2 | 6/2008 | Aitken et al. |
| 7,460,385 | B2 | 12/2008 | Gruber et al. |
| 7,514,271 | B2 | 4/2009 | Gaidis et al. |
| 7,526,743 | B2 | 4/2009 | Arp et al. |
| 7,538,338 | B2 | 5/2009 | Rinerson et al. |
| 7,742,323 | B2 | 6/2010 | Rinerson et al. |
| 8,314,024 | B2 * | 11/2012 | Rinerson et al. ............... 438/598 |
| 2003/0151959 | A1 | 8/2003 | Tringali et al. |
| 2006/0023497 | A1 | 2/2006 | Kawazoe et al. |
| 2006/0125102 | A1 | 6/2006 | Wu et al. |
| 2007/0155145 | A1 | 7/2007 | Hong |
| 2007/0166989 | A1 | 7/2007 | Fresco et al. |
| 2007/0223282 | A1 | 9/2007 | Sarig |
| 2008/0054317 | A1 | 3/2008 | Kim |
| 2008/0079029 | A1 | 4/2008 | Williams |
| 2008/0084727 | A1 | 4/2008 | Norman |
| 2008/0090337 | A1 | 4/2008 | Williams |
| 2008/0173975 | A1 | 7/2008 | Chen et al. |
| 2008/0237800 | A1 | 10/2008 | Chinthakindi et al. |
| 2009/0016094 | A1 | 1/2009 | Rinerson et al. |
| 2009/0146325 | A1 | 6/2009 | Liu et al. |

OTHER PUBLICATIONS

Rinerson, Darrell, U.S. Appl. No. 12/454,322, filed May 15, 2009, Office Action dated Mar. 21, 2012 re Restriction Requirement. 6 pages.

Rinerson, Darrell, U.S. Appl. No. 12/454,322, filed May 15, 2009, Response dated Mar. 21, 2012 to the Restriction Requirement of Mar. 21, 2012. 9 pages.

* cited by examiner

DEVICE FABRICATION

RELATED APPLICATIONS

This application is a division of U.S. patent application Ser. No. 12/454,322, filed on May 15, 2009, now issued as U.S. Pat. No. 8,314,024, which is a non-provisional of U.S. provisional Ser. No. 61/203,192, filed Dec. 19, 2008, and U.S. provisional Ser. No. 61/203,163, filed Dec. 19, 2008, and U.S. provisional Ser. No. 61/203,187, filed Dec. 19, 2008, all of which is incorporated herein in their entirety.

FIELD

The present invention relates generally to semiconductor and memory fabrication. More specifically, bifurcated device fabrication flows and models are described.

BACKGROUND

Conventional solutions for fabricating semiconductor and integrated circuit devices have a substantial and direct effect on the cost of production and indirect effects on the potential revenue generated from the sale of commercial electronic products. However, conventional solutions are inefficient and do not account for product development trends. Typically, fabrication facilities do not optimize initial capital investment in tooling, machinery and equipment due to the rapidly advancing development in semiconductor technology. In other words, conventional solutions typically require large expenditures for capital investment in equipment used to fabricate semiconductor devices, which often becomes obsolete before the equipment has been fully depreciated, resulting in the loss of potential utilization. This trend with conventional solutions typically occurs due to the rapid rate of change in technological innovation in semiconductor-related technologies, particularly the reduction in size of semiconductor feature sizes and the ability to place a larger number of semiconductor devices such as transistors in a smaller area. Cost and time inefficiencies in conventional semiconductor development process typically result in overall industry cost increases due to relatively short usage of expensive equipment that is typically taken out of use before being fully depreciated.

Semiconductor device research and development is at the cutting edge of technology. The rapid rate of growth and development within the industry requires manufacturers to continuously update and modernize their tooling, machinery and equipment in order to remain competitive with other semiconductor manufacturers. However, non-fully depreciated equipment may be taken off line before being fully utilized (i.e., fully-depreciated) and set aside or often sold to other manufacturers at discounted prices resulting in substantial loss. These losses are typically accepted since the revenue generating potential of new semiconductor devices typically outweighs the loss of removing older equipment from service. The significant time and capital required to establish and maintain a modern fabrication facility typically contributes to the higher costs of semiconductor devices initially. As the equipment is removed from service, semiconductor device prices typically fall as semiconductor equipment is sold to second-line manufacturers. Yet costs are still relatively high for conventional semiconductor device manufacturers due to typical process allocation of semiconductor fabrication.

Conventional solutions for semiconductor device fabrication typically involve a single fabrication facility performing a range of processes, including conventional front-end-of-the-line (i.e., FEOL) fabrication processes and conventional back-end-of-the-line (i.e., BEOL) fabrication processes. As one example, conventional FEOL fabrication can include all processing steps necessary to fabricate a functional die including CMOS circuitry fabricated on the die (e.g., a die on a semiconductor substrate such as a silicon wafer) and in some applications memory fabricated on the same die as the CMOS circuitry. Whereas, conventional BEOL fabrication can include metallization steps to form pads for solder bumps, cutting (e.g., singulating) die from FEOL wafers and placing individual die in a package and electrically connecting pads on the die with bonding pads on the package, or attaching solder bumps to an array of pads on the die in preparation for attaching the die with a flip-chip package. The BEOL fabrication can also include soldering the die to the flip-chip package and encapsulating the die. However, the cost of tooling a fabrication facility to perform both conventional FEOL and conventional BEOL processes is expensive. Further, the costs of tooling for performance of BEOL processes is substantially more expensive than FEOL processes, the latter of which typically involves the fabrication of base complementary metal oxide semiconductor (CMOS) wafers. As the technology for BEOL processes advances with new innovations in semiconductor device technologies such as memory, processors, and the like, costs associated with tooling to meet fabrication demands are typically high and increasing, particularly if BEOL processes are being performed for a number of individually developed technologies such as integrated circuits for memory, processing, graphics processing/acceleration, or other functions. However, conventional FEOL and BEOL solutions are expensive to use when developing new memory technologies since unique tooling and equipment are required for the fabrication of the memory elements of a semiconductor device. In other conventional solutions, when a company considers entering the industry of semiconductor fabrication, the startup costs associated with purchasing equipment to perform conventional FEOL and BEOL processes are prohibitively expensive, requiring substantial startup investment costs. Although some conventional solutions may generalize the formation of devices on a silicon or other type of substrate, the interconnecting wiring, metal, or other layers deposited during the BEOL processes are typically different for each "fabless" semiconductor organization (i.e., company) that has developed a specialized application for the products resulting from the FEOL processes. Regardless of whether these companies intend to focus on the development of products resulting from BEOL processes, investment must still be made in equipment in order to form the necessary base CMOS wafers associated with FEOL processes. In other words, advancements in technology are generally associated only with the back end of the line BEOL processes. Front end of the line FEOL processes, such as forming circuitry on a substrate are standardized. However, conventional fabrication methods do not allow one facility to invest in just FEOL techniques or just BEOL techniques. Conventional methods require investment in tooling, equipment and machinery necessary to effectively manufacture a semiconductor device.

There are continuing efforts to improve non-volatile memory fabrication technology, processes, and business models.

BRIEF DESCRIPTION OF THE DRAWINGS

Various embodiments of the invention are disclosed in the following detailed description and the accompanying drawings.

Figure 1A:
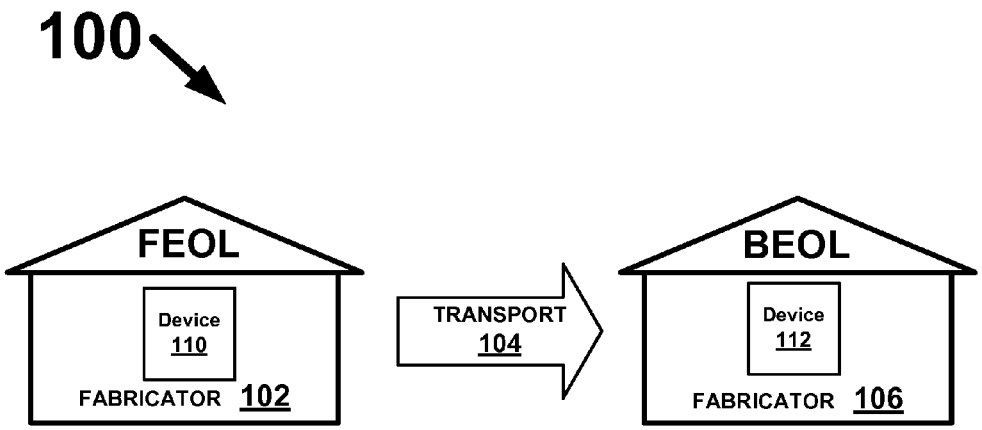
FIG. 1A depicts an exemplary device fabrication system.

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description. The described fabrication techniques may be varied and are not limited to the examples provided.

FIG. 1A depicts an exemplary device fabrication system. Here, system 100 is shown with fabricator 102, transport 104, fabricator 106, device 110 and device 112. In some examples, the term "fabricator" may refer to a semiconductor fabrication or manufacturing facility, plant, foundry, or the like. As shown here, fabricator 102 may perform one or more front-end-of-the-line (i.e., FEOL) processes to form base CMOS wafers including, in some examples, a minimum number of transistors and interconnects for logic formed during the FEOL processes using equipment, machinery or tools to form device 110. For example, device 110 can comprise a silicon wafer including a plurality of die with each die including CMOS circuitry fabricated FEOL on the die. The FEOL processing comprises only a portion of the total processing on the die necessary to form a completed integrated circuit (IC). Upon completion of the FEOL processing, each die will undergo additional back-end-of-the-line processing to fabricate one or more layers of memory on each die. Once completed, in some examples, products resulting from FEOL processes (e.g., base CMOS wafers, or other products such as device 110) may be transported via transport 104 to another facility (i.e., fabricator 106) for performing the back-end-of-the-line (i.e., BEOL) processes to produce (i.e., fabricate, manufacture, form, or otherwise make) device 112. For example, device 112 can comprise the silicon wafer of device 110 after the BEOL processing has been performed on the wafer such that each die on the wafer for the device 112 includes the CMOS circuitry fabricated FEOL by fabricator 102 and one or more layers of memory fabricated BEOL above the CMOS circuitry. Accordingly, each die at the completion of the BEOL processing is a unitary structure that includes a substrate (e.g., a silicon die) with CMOS circuitry FEOL fabricated thereon and one or more layers of memory vertically fabricated BEOL over the CMOS circuitry. In some examples, transport 104 may represent any type of transportation mechanism, mode, or vehicle, including air, sea, and land transport, including the use of aircraft, cargo ships, and transportation fleet vehicles, respectively. Transport can also represent the movement of the device 110 from one section of a manufacturing facility where the FEOL processing occurs to another section of the same manufacturing facility where the BEOL processing occurs.

In some examples, fabricator 106 may perform one or more BEOL processes using equipment, machinery or tools to transform device 110 into device 112. In some examples, FEOL processes performed by fabricator 102 may include forming a substrate, patterning a circuit, depositing metal layers, testing, or depositing a shield layer and may be performed by techniques such as oxidation, photolithography, etching, ion implantation, metallization or others. As an example, the use of older fabrication equipment to fabricate, manufacture, or otherwise form (i.e., make) base wafers may be implemented to enable lower fabrication costs. In some examples, "older" equipment may refer to any and all types of semiconductor fabrication equipment that has been depreciated more than other equipment used by the same fabrication facility, plant, foundry, or the like. Alternatively, in other examples, "older" equipment may also refer to semiconductor fabrication equipment that is configured to produce or fabricate semiconductor chips with a feature size that is equal to or greater than another type of semiconductor chip that is being manufactured by the same fabrication facility, plant, foundry, or the like. That is, the "older" equipment is configured to fabricate semiconductor chips with larger feature sizes (e.g., 90 nm) than other "newer" equipment configured to fabricate semiconductor chips with smaller feature sizes (e.g., 45 nm) than the "older" equipment. Moreover, fabricator 102 may perform post fabrication processes on device 110 prior to transport 104 including but not limited to testing (e.g., using automatic testing equipment—ATE) finished FEOL wafers for good functional die on the wafer using electrical tests, test vectors, and the like, and identify die on the wafer that either passed or failed the testing procedures. Fabricator 102 may contract out to a third party some of the above mentioned processes.

In some examples, BEOL processes performed by fabricator 106 may include but are not limited to scrubbing a shield layer, patterning a circuit, depositing metal layers, testing, and forming connections and may be performed by techniques such as oxidation, photolithography, etching, ion implantation, metallization or others. In other examples, the quantity, type, function, capabilities, and other aspects of the elements shown in system 100 may be varied and are not limited to any examples shown or described. Other examples of BEOL processes performed by fabricator 106 may include but are not limited to testing (e.g., using ATE) finished die on a wafer for functionality, electrical parameters, etc., yield and the like, singulating the wafer to form individual die (e.g., good die from testing), packaging the die to form integrated circuit devices, and testing the integrated circuit devices. Fabricator 106 may contract out to a third party some of the above mentioned processes. As described above, the finished die comprises the FEOL CMOS circuitry portion and the BEOL memory portion. Unlike conventional multi-chip module technology or other technologies where a first die is electrically coupled with a second die using solder bumps, wire bonding, or the like, the finished die from the BEOL processing is a structure that is a unitary whole because the memory layers of the BEOL memory portion are grown directly on top of the FEOL CMOS circuitry portion using microelectronics fabrication processes including but not limited to thin-film deposition, chemical mechanical polishing, ion implantation, plasma etching, physical deposition, and photolithography, just to name a few.

As shown here, device 112 may be the product or resultant semiconductor device fabricated by system 100 and may include a two-terminal, three-terminal or multi-terminal semiconductor device such as a diode, transistor, memory device, microprocessor, or the like, formed FEOL. In other examples, system 100 may be implemented to fabricate, manufacture, construct, produce or create a different semiconductor device FEOL and is not limited to the examples shown and described.

As shown here, device 110 may constitute a portion of a semiconductor device (e.g., device 112). In some examples, device 110 may be the result of FEOL processes being performed by fabricator 102. For example, after completion of one or more FEOL processes, device 110 may comprise a base wafer. As another example, device 110 may comprise a substrate, one or more interconnects (e.g., for connection or coupling to logic (not shown)), and a decoder. As yet another example, device 110 may comprise a base CMOS wafer (e.g., a 300 mm silicon Si wafer) having underlying circuitry and drivers patterned for deposition of other materials or formation of devices during the performance of subsequent BEOL processes. In some examples, the base wafer may include a substrate.

As shown here, system 100 includes transport 104, which as an example, may represent a physical transfer or re-location of device 110 from fabricator 102 to fabricator 106 (i.e., from one fabrication facility to another fabrication facility). In some examples, transport 104 may be accomplished by any mechanical or non-mechanical means of moving, shipping, hauling, carrying, delivering, conveying or otherwise transporting. In other examples, transport 104 may be by automobile, airplane, boat, railroad, conveyor belt or other means of motorized transportation. In other examples, transport 104 may be by non-motorized transportation. In yet other examples, transport 104 may be over long or short distances, without limitation. For example, a foundry based in a series of buildings may have a fabrication facility configured to perform FEOL processes in one building and another fabrication facility located in another building in close proximity to the former to perform BEOL processes. In still other examples, different fabrication facilities may be based within a given building and transport 104 may also include shipment via short-distance implementations (e.g., manual, conveyor belt, robotic or motorized transport or transfer, and others). Transport 104 may also include transfer, shipment, or travel over any distance, whether relatively long or short. As an example, device 110 may be assembled and packaged (e.g., placed in a suitable shipping container) at fabricator 102. Thereafter, packaged device 110 may be placed into a truck or airplane and shipped, moved, delivered, transferred, or otherwise transported to fabricator 106. As examples, fabricator 102 and fabricator 106 may be located on the same or different street, locale, city, state, country, or other geographic region. For example, fabricator 102 may be in California and fabricator 106 may be in New York. In other examples, transportation utilized for transport 104 and the distance traveled during transport 104 may vary and are not limited to the examples provided.

As shown here, system 100 may include a first fabrication facility (e.g., fabricator 102) and a second fabrication facility (e.g., fabricator 106). In other examples, system 100 may include any number of fabrication facilities, and is not limited to the quantities as shown or described. Here, fabricator 102 and fabricator 106 may be related or unrelated business entities. In other words, fabricator 102 and fabricator 106 may be operated by the same or different business entities or organizations. For example, fabricator 102 may be a wholly owned or a partially owned subsidiary company of fabricator 106. In some examples, fabricator 102 and fabricator 106 may be located in the same physical geographic location (i.e., in the same building, same building complex, adjacent buildings, contiguous buildings or the like). In still other examples, fabricator 102 and fabricator 106 may be located in different geographic locations (e.g., in a different building, town, state, county, country or the like). In still other examples, the business or geographic relationship between fabricator 102 and fabricator 106 or any other fabrication facility may be varied and is not limited to any of the examples provided. Moreover, either one or both of fabricators 102 and 106 may contract out portions of the fabrication processes (e.g., microelectronics processing, testing, wafer sort, assembly, packaging, wafer sawing, etc.) to third parties that may be in the same of different geographic locales.

In some examples, fabricator 102, fabricator 106, or any other fabrication facility may own, rent, lease or otherwise possess capital assets (e.g., equipment, tools, machinery or other capital asset) configured for fabrication or manufacture of semiconductor devices. As shown here, fabricator 102 may have capital assets configured to perform FEOL fabrication processes and fabricator 106 may have capital assets configured to perform BEOL fabrication processes. In some examples, implementation of system 100 may allow the capital assets used by fabricator 102 or fabricator 106 to be utilized for a life span long enough to allow for full or partial depreciation of the capital asset. As an example, fabricator 102 may perform FEOL processes, such as fabricating a base wafer for a semiconductor device through formation of a substrate, wherein the process utilized to form a base wafer for a semiconductor device may be based upon one or more technology standards established in the semiconductor fabrication industry, without limitation. In this example, separating FEOL processes from BEOL processes may allow for semiconductor fabrication equipment (e.g., "fabrication equipment," "equipment," "asset", "capital assets") used by fabricator 102 to have an extended working life span, until the capital investment costs used to acquire an asset has sufficient time to fully depreciate, thereby fully realizing the cost of the investment. Subsequently, fabless semiconductor companies and organizations can focus on developing BEOL processes as opposed to FEOL and BEOL processes, including for memory applications, which are typically technically complex and difficult to standardize between different types of memory technologies (e.g., SRAM, DRAM, SDRAM, FLASH®, volatile, non-volatile, and others), thus lowering the overall cost of developing, research, making, marketing, and selling a product (i.e., a semiconductor chip, processor, or memory). In other examples, the economic life span of assets owned, rented, leased, or otherwise possessed by fabricator 102, fabricator 106 or any other fabrication facility, including those not shown, may vary and is not limited to the examples and descriptions provided. In other examples, the elements shown and described may be implemented differently and are not limited to the examples or descriptions provided.

Figure 1B:
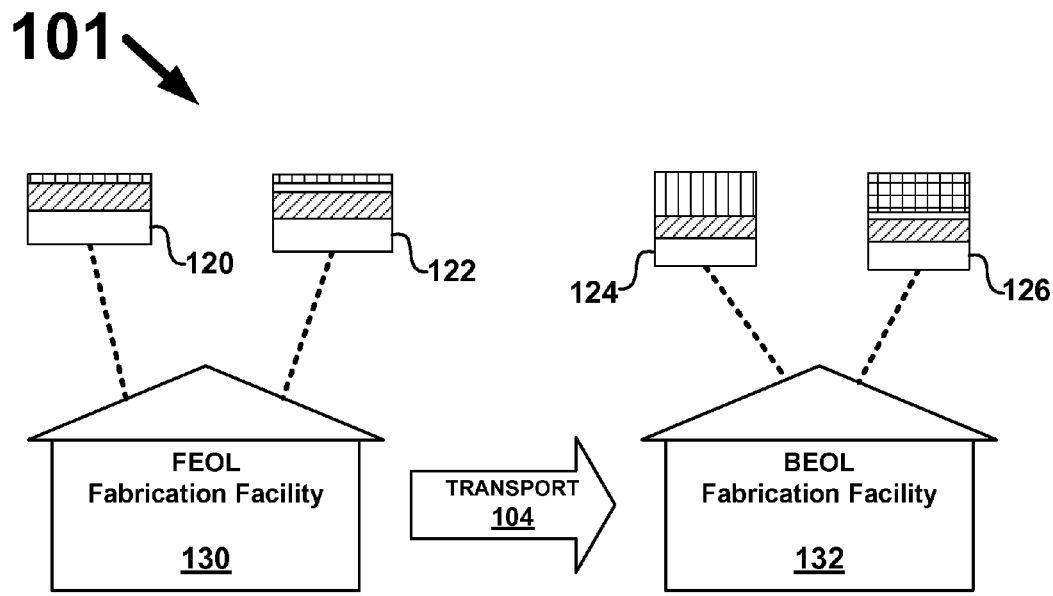
FIG. 1B depicts a further exemplary device fabrication system.

FIG. 1B illustrates a further exemplary device fabrication system. Here, device fabrication 101 is shown with transport 104, device 120, device 122, device 124, device 126, FEOL fabrication facility 130 and BEOL fabrication facility 132 and depicts an alternative schematic diagram of an exemplary process for fabrication, manufacture or production of semiconductor devices. Here, devices 120, 122, 124, and 126 are depicted in cross-sectional view to illustrate that die fabricated at the FEOL facility 130 where circuitry for example is fabricated on the die, undergo a transformation resulting from subsequent processing at the BEOL facility 132 where additional layers of material are fabricated (e.g., grown) on each die to form one or more layers of memory on top of each die, for example. In some examples, transport 104 may be implemented similarly or substantially similar in function and structure to transport 104 as shown and described in FIG. 1A. In other examples, transport 104 may be implemented differently and is not limited to the examples and descriptions provided.

In some examples, FEOL fabrication facility 130 may be configured to perform one or more processes associated with fabricating, for example, device 120 or device 122. As used herein, FEOL fabrication facility 130 and BEOL fabrication facility 132 may each include one or more semiconductor fabrication processes associated with FEOL circuitry or BEOL memory fabrication techniques, respectively. After completion of FEOL fabrication by facility 130, device 120 may be transformed to device 124 or device 122 may be transformed to device 126 through fabrication by BEOL facility 132. In other words, devices 120-122 are representative of different types of devices (e.g., active CMOS circuitry) resulting from one or more processes performed by FEOL fabrication facility 130. Likewise, devices 124-126 are representative of different types of devices (e.g., two-terminal cross-point memory arrays) that may be produced by BEOL fabrication facility 132. As an example, FEOL fabrication facility 130 may include forming a substrate, depositing metal layers, testing, depositing a shield layer, or the like. As another example, BEOL fabrication facility 132 may include scrubbing a shield layer, depositing metal layers, depositing one or more thin-film layers of a conductive metal oxide, depositing a very thin layer of tunnel barrier material (e.g., 50 Å or less) on top of an uppermost layer of the conductive metal oxide to form a memory element, depositing additional layers of thin-film materials to form a non-ohmic device (NOD) electrically in series with the memory element, testing, forming one or more connections to create a memory array, or the like. FEOL fabrication facility 130 may be performed through any semiconductor fabrication technique, such as oxidation, photolithography, etching, ion implantation, metallization or others. BEOL fabrication facility 132 may be performed through any semiconductor fabrication technique, such as oxidation, photolithography, etching, ion implantation, metallization or others.

In some examples, FEOL fabrication facility 130 may be a first fabrication facility, such as fabricator 102 (FIG. 1A) and BEOL fabrication facility 132 may be a second fabrication facility, such as fabricator 106 (FIG. 1A). Further, FEOL fabrication facility 130 may be a different fabrication facility than BEOL fabrication facility 132. As an example, device 120 may be formed (e.g., depositing materials to create a base CMOS wafer, such as forming interconnects, decoders, transistors, or other electronic devices) at fabricator 102 (FIG. 1A) by implementation of FEOL fabrication facility 130. Device 120 may be transferred to fabricator 106 (FIG. 1A)

where fabricator 106 may implement BEOL fabrication facility 132 to form device 124 (e.g., depositing metal or other materials to form a third-dimensional, passive, non-volatile, two-terminal, or other type of memory array. In some examples, equipment, machinery, tools or other semiconductor fabrication apparatus may be implemented at the FEOL fabrication facility 130 (e.g., to form device 120 or device 122) and/or BEOL fabrication facility 132 (e.g., to transform device 120 into device 124, or transform device 122 into device 126). In other examples, FEOL fabrication facility 130 and BEOL fabrication facility 132 may be implemented differently and are not limited to the examples or descriptions provided. In still other examples, the elements shown and described may be implemented differently and are not limited to the examples or descriptions provided.

Figure 1C:
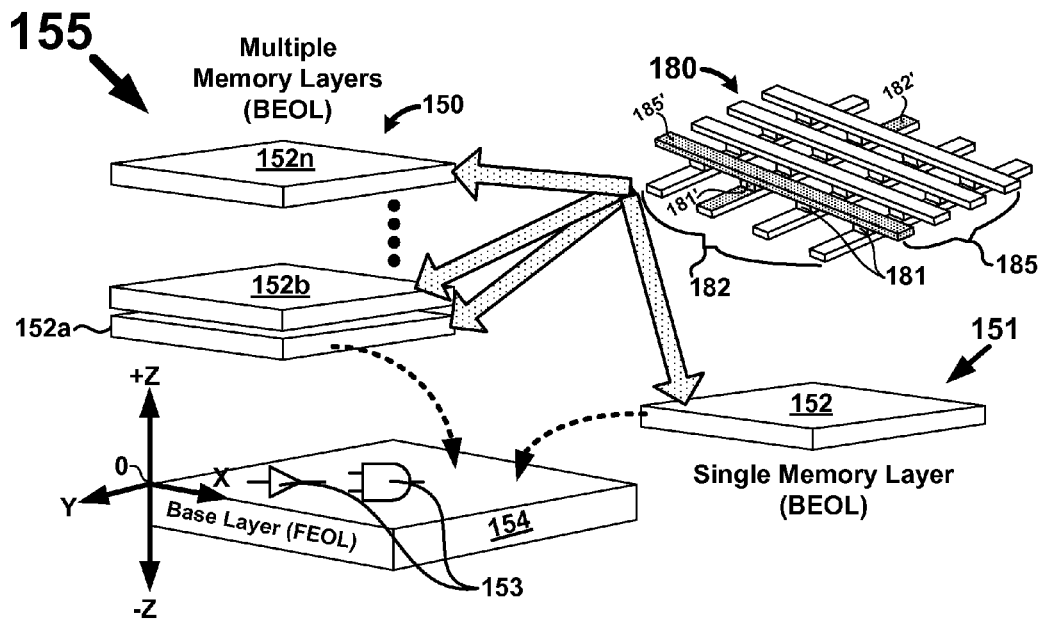
FIG. 1C depicts a single layer or multiple layers of memory arrays formed BEOL on top of a base layer including circuitry formed FEOL.

FIG. 1C illustrates an integrated circuit including memory cells disposed in a single layer or in multiple layers of memory, according to various embodiments of the invention. In this example, integrated circuit 155 is shown to include either multiple layers 150 of memory (e.g., layers 152a, 152b, ... 152n) or a single memory layer 151 (e.g., layer 152) formed on a base layer 154. The single memory layer 151 or the multiple memory layers 152a, 152b, ... 152n are fabricated vertically above the base layer 154 along the +Z axis as denoted by the +Z on the X-Y-Z axes; whereas, the base layer 154 and its associated circuitry are positioned below the memory layer(s) on the −Z axis. In at least some embodiments, each layer (e.g., layer 152 or layers 152a, 152b, ... 152n) of memory can be a cross point memory array 180 including conductive array lines 182 and 185 arranged in different directions to access re-writable memory cells 181 such as two-terminal memory cells. Examples of conductive array lines include X-lines conductive array lines (e.g., 182) and Y-lines conductive array lines (e.g., 185). The two-terminal memory cells 181 can be passive non-volatile re-writable memory devices operative to store data as a plurality of conductivity profiles that can be reversibly switched by applying a write voltage of appropriate magnitude and polarity across the two terminals of the two-terminal memory cells 181 (e.g., part of a data operation, such as a write operation). A first polarity and magnitude of the write voltage can be operative to program the memory cell 181 and a second polarity and magnitude of the write voltage can be operative to erase the memory cell 181. The erase can be accomplished without having to erase an entire block of memory within the array. The write voltage can be generated by circuitry in the base layer 154 and electrically coupled with the X direction 182 and the Y direction 185 conductive array lines that are connected with the two-terminal memory cell 181. The value of stored data in each two-terminal memory cell can be non-destructively determined by applying a read voltage across the two terminals of the memory cell (e.g., as part of a data operation, such as a read operation). The read voltage is typically lower in magnitude than the write voltage (e.g., 2V for Read and 4V for Write) in order to prevent stored data from being disturbed or corrupted by the application of the read voltage. The read voltage is operative to generate a read current in the memory cell and a magnitude of the read current is indicative of the value of stored data in the memory cell 181 (e.g., a magnitude of the read current is inversely proportional to the value of the conductivity profile stored in the memory cell being read). Application of the read voltage does not alter the value of data stored in the memory cell. As mentioned above, circuitry fabricated on the base layer 154 and positioned below the memory layer(s) is configured to perform data operations (e.g., read, write, and restore operations) on the arrays or other data storage structures (e.g., embedded non-volatile memory) positioned in the memory layer(s).

Base layer 154 can include a bulk semiconductor substrate (e.g., a silicon wafer) upon which memory access circuits 153 are fabricated and configured for performing data operations on the memory cells 181 in memory 150 or 151. Base layer 154 may include other circuitry that may or may not be related to data operations on memory. Referring back to FIGS. 1A and 1B, base layer 154 and circuitry 153 (e.g., device 110) are formed FEOL by fabricator 102 and/or fabrication facility 130 and multiple memory layers 150 or single memory layer 151 (e.g., device 112) are formed BEOL on top of the base layer 154 by fabricator 106 and/or fabrication facility 132. For purposes of illustration, the layer 152 or the layers 152a, 152b, ... 152n are depicted as being separate from the base layer 154; however, the layer 152 or the layers 152a, 152b, ... 152n are fabricated BEOL directly on top of the FEOL base layer 154 such that the resulting die is a unitary whole comprising a bottommost FEOL portion (e.g., base layer 154) and an upper BEOL portion (e.g., layer 152 or layers 152a, 152b, ... 152n) fabricated vertically (e.g., +Z axis) above the FEOL portion (see die 173 in FIGS. 8A and 8C). The vertical fabrication (i.e., growing the memory layer(s) on top of the base layer 154) can include but is not limited to a variety of thin-film layer deposition techniques, such as physical deposition, chemical vapor deposition (CVD), pulsed laser deposition, atomic layer deposition (ALD), sputtering, and co-sputtering, just to name a few.

One advantage to using a passive memory device is that the memory cell does not require a transistor(s) or other active devices and therefore the memory cell and its associated array don't need to be fabricated on a substrate (e.g., a silicon wafer) along with the active devices (e.g., CMOS circuitry). Fabricating the memory layers above the base layer eliminates the need for an expensive custom memory fab in which the memory and the active circuitry that performs data operations on the memory are fabricated on the same substrate (e.g., the same silicon wafer). Accordingly, a process flow for fabricating an IC that incorporates BEOL memory layers starts the manufacturing flow in a standard CMOS logic foundry where the base wafer is fabricated using trailing-edge technology at the lowest possible cost as part of a FEOL process. Upon completion of the FEOL processing, the base wafer is transferred to a BEOL memory fab where the one or more layers of memory are fabricated directly on top of the base layer (e.g., die 154) using a standard metallization process and using a leading-edge fabrication technology selected for fabricating BEOL memory layers. This bifurcated fabrication strategy (e.g., FEOL for base circuitry wafer and BEOL for memory layers) has the advantage of enabling lower base wafer cost of manufacturing by using the trailing-edge FEOL technology (e.g., 90 nm feature sizes) enabling older production lines (e.g., CMOS logic) to serve as the FEOL foundry. No new investment in FEOL processing is needed. As the BEOL fabrication technology evolves from the current leading-edge BEOL process to a more advanced BEOL process (e.g., going from 45 nm to 25 nm), then higher storage density BEOL memory devices can be fabricated BEOL using the new more advanced BEOL process while still taking advantage of the low cost and mature FEOL front end technology to fabricate the base wafer. As leading-edge FEOL processes (e.g., 45 nm feature sizes) go on-line and become the latest low cost trailing-edge processes that replaces the previous trailing-edge technology (e.g., 90 nm feature sizes), the FEOL processing can be moved to a foundry that implements the latest low cost trailing-edge processes.

Figure 1D:
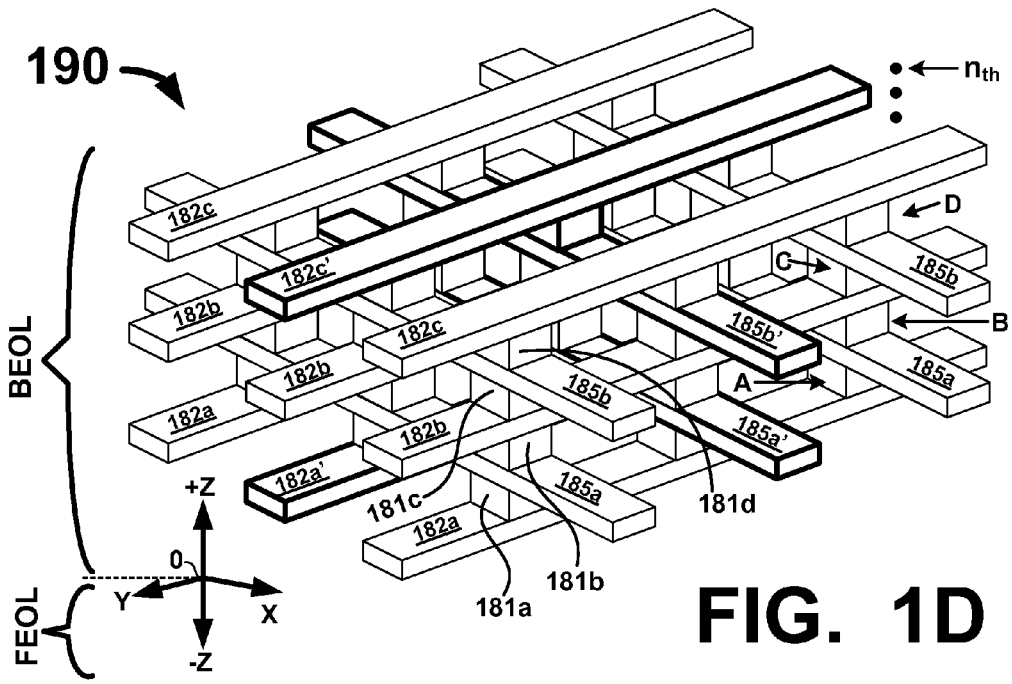
FIG. 1D depicts one example of vertically stacked memory including array layers that share conductive array lines and formed BEOL on top of a previously formed FEOL base layer.

Moving on to FIG. 1D, where a vertically stacked array 190 includes a plurality of memory layers A,B,C, and D with each memory layer including memory cells 181a, 181b, 181c, and 181d. Although only four layers are depicted, the array 190 can include additional layers up to an nth layer, or fewer layers than depicted. The array 190 includes three levels of x-direction conductive array lines 182a, 182b, and 182c, and two levels of y-direction conductive array lines 185a, and 185b. The memory cells 181a, 181b, 181c, and 181d share conductive array lines with other memory cells that are positioned above, below, or both above and below that memory cell. The conductive array lines, the memory cells, dielectric materials that electrically isolate structures in the array 190 (not shown), and other structures in the array 190 are all formed BEOL above the base layer 154 (not shown) as indicated by +Z on the Z-axis above the dashed line at origin 0; whereas, the active circuitry for performing data operations on the array 190 and the interconnect structure (not shown) for electrically coupling the active circuitry with the array 190 (e.g., the conductive array lines) are previously formed FEOL as indicated by −Z on the Z-axis below the dashed line at origin 0. Accordingly, the BEOL structure for array 190 is formed (e.g., grown) on top of the FEOL structure for base layer 154 with the order of fabrication going in a direction from −Z (i.e., FEOL) to +Z (i.e., BEOL) along the Z-axis.

Figure 1E:
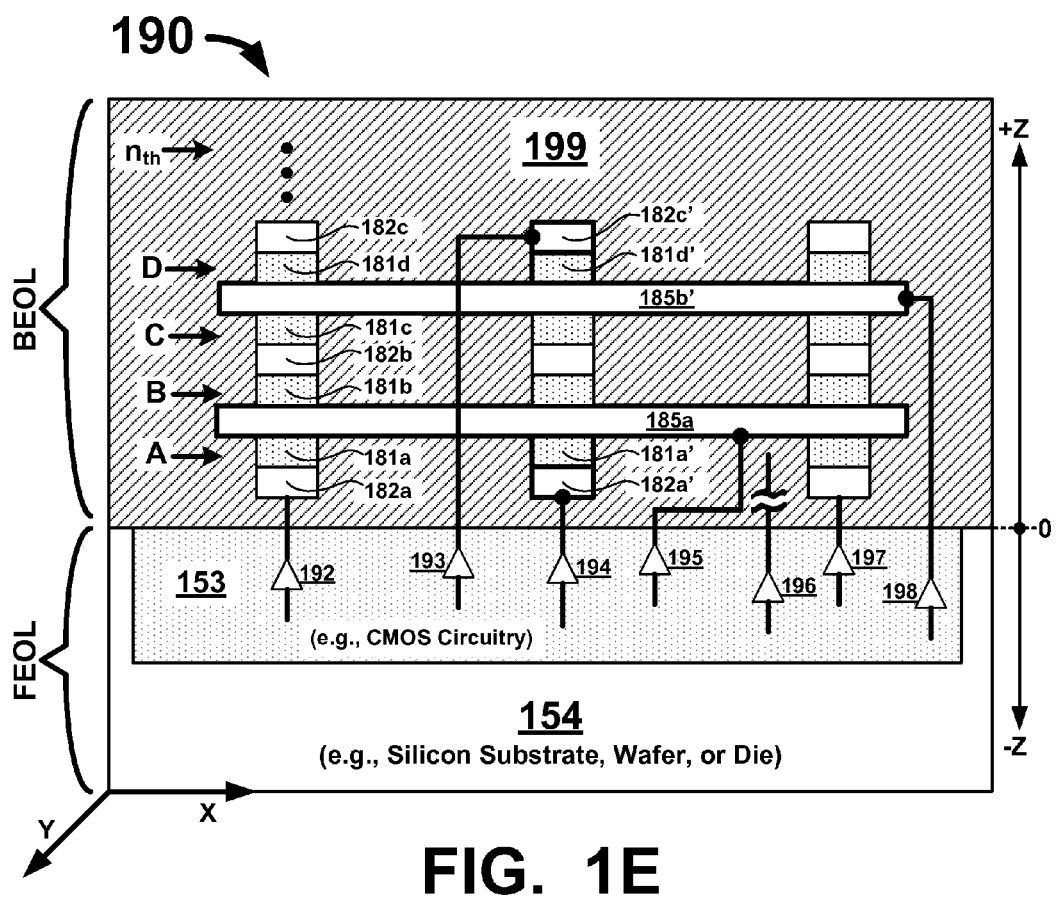
FIG. 1E depicts a cross-sectional view of the vertically stacked memory of FIG. 1D and active circuitry in the base layer.

Turning now to FIG. 1E, a more complete cross-sectional view of the array 190 and base layer 154 includes active circuitry 153 fabricated FEOL on the base layer 154 (e.g., along the −Z axis), and vertically staked memory layers A, B, C, and D that are fabricated BEOL above the base layer 154 (e.g., along the +Z axis). Active circuits 192-198 are configured to perform data operations (e.g., reading and writing data) on the vertically staked memory layers A, B, C, and D. Driver circuits 194 and 195 are activated to select memory cell 181a' for a data operation and driver circuits 193 and 198 are activated to select memory cell 181d' for a data operation. For purposes of explanation, other circuitry such as sense amps, decoders, voltage sources, multiplexers, and the like are not shown. A dielectric material 199 is operative to electrically isolate the various components of array 190. Electrically conductive structures that electrically couple the active circuits 192-198 with the array 190 can be positioned in an inter-level interconnect structure (not shown) formed FEOL and including vias, conductive traces, plugs, thrus, damascene structures, and the like.

Figure 1F:
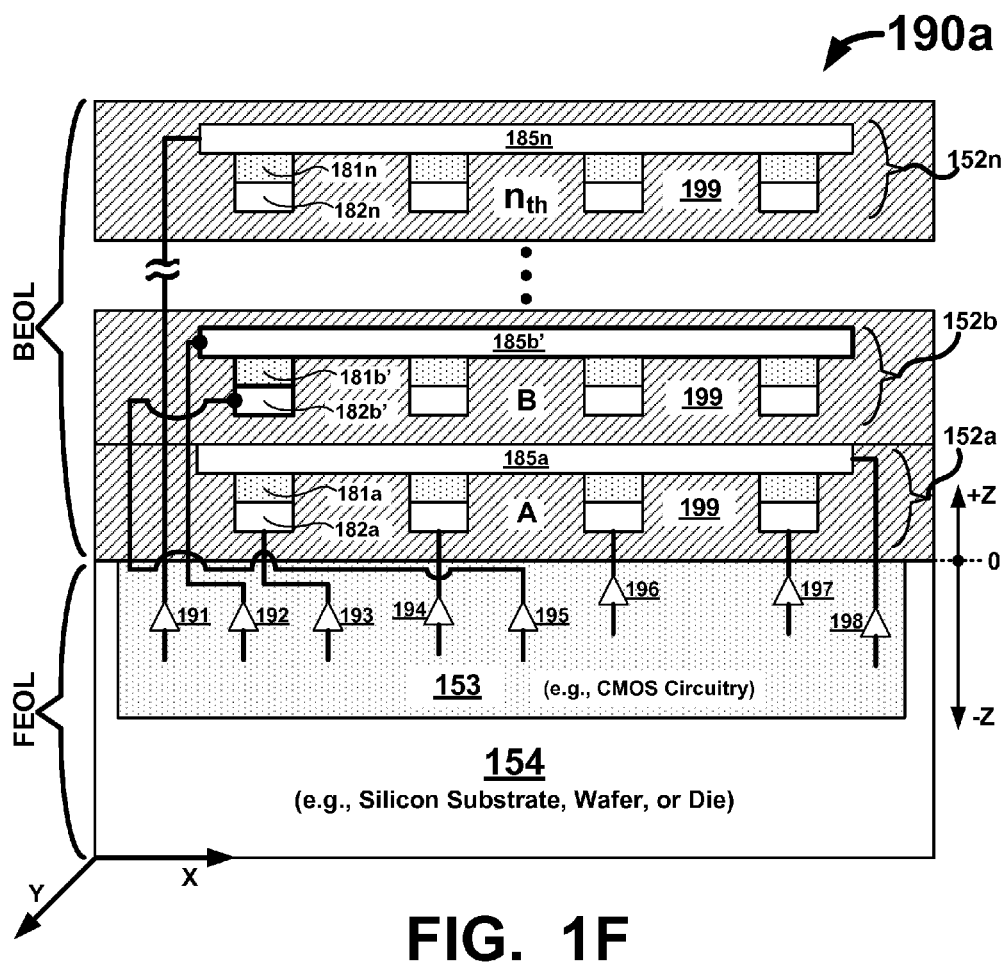
FIG. 1F depicts a cross-sectional view of another example of vertically stacked memory formed BEOL on top of a FEOL base layer including active circuitry.

Moving now to FIG. 1F, a cross-sectional view of an alternative configuration where the conductive array lines in different memory layers are electrically isolated from one another is depicted. Array 190a includes a plurality of non-volatile memory arrays that are vertically stacked above one another (e.g., along the +Z axis) and are positioned above the base layer 154 that includes the active circuitry 153. Array 190a includes vertically stacked memory layers A and B and may include additional memory layers up to an nth memory layer. The memory layers A, B, . . . through the nth layer can be electrically coupled with the active circuitry 153 in the base layer 153 by an inter-level interconnect structure (not shown) as was described above. Layer A includes memory cells 181a and first and second conductive array lines (182a, 185a), Layer B includes memory cells 181b and first and second conductive array lines (182b, 185b), and if the nth layer is implemented, then the nth layer includes memory cells 181n and first and second conductive array lines (182n, 185n). Dielectric materials 199 (e.g., SiO$_2$) may be used where necessary to provide electrical insulation between the memory layers of the array 190a. Active circuits 191-198 can be configured to apply the select voltage potentials for data operations (e.g., read and write voltage potentials) to selected conductive array lines (e.g., 182a, b, . . . n, and 185a, b, . . . n). Driver circuits 192 and 195 are activated to select conductive array lines 182b' and 185b' to select memory cell 181b' in layer B for a data operation (e.g., to read data from or write data to memory cell 181b').

The cross-sectional views depicted in FIGS. 1E and 1F clearly illustrate the transformation of the FEOL processed die 154 that includes active circuitry fabricated on the die 154 to a completed die that includes one or more memory layers vertically fabricated BEOL directly on top the die 154 and its associated active circuitry. Therefore, the transformation from FEOL die to BEOL die results in growth of the die in the vertical direction, that is, along the +Z axis. Consequently, the BEOL processing can add additional memory layer(s) or some other structure without increasing the area dimension of the die (e.g., no increase in the X-Y dimensions of the die).

Figure 1G:
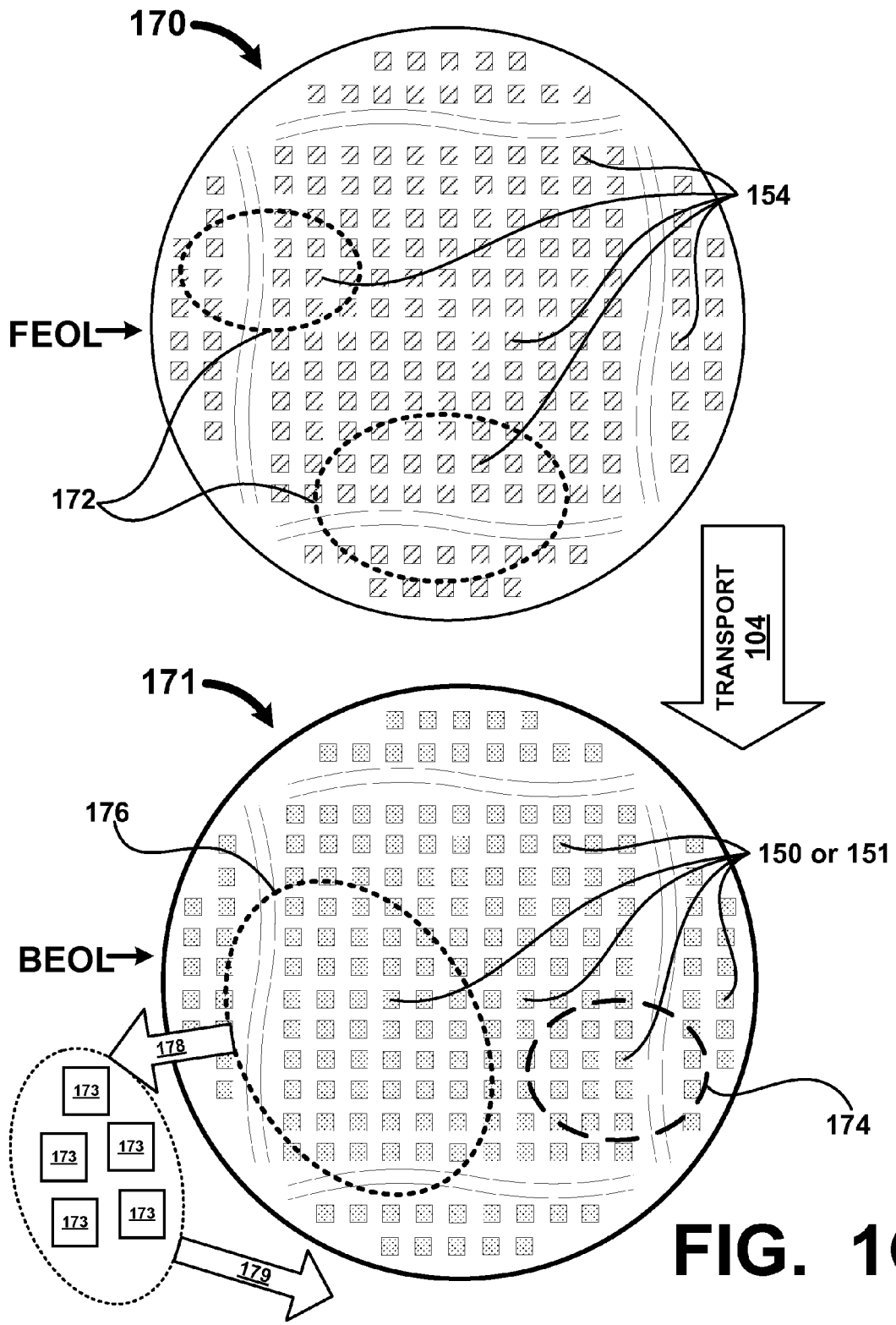
FIG. 1G depicts top plan views of a wafer processed FEOL to form a plurality of FEOL circuitry die on a base wafer and subsequent BEOL processing of the base wafer to form a plurality of die including BEOL memory devices which can subsequently be singulated, tested, and packed into integrated circuits.

Reference is now made to FIG. 1G, where a top plan view depicts two wafers 170 and 171. Wafer 170 includes a plurality of base layer die 154 formed individually on wafer 170 as part of the FEOL process. As part of the FEOL process, the base layer die 154 may be tested 172 to determine their electrical characteristics, functionality, performance grading, etc. After all FEOL processes have been completed, the wafer 170 is transported 104 for BEOL processing (e.g., adding one or more layers of memory on top of each base layer die 154). Base layer die 154 that failed testing may be identified either visually (e.g., by marking) or electronically (e.g., in a file, database, email, etc.) and communicated to the BEOL fabricator 106 and/or fabrication facility 132. Similarly, performance graded base layer die 154 (e.g., graded as to frequency and/or speed of operation) may be identified and communicated to BEOL fabricator 106 and/or fabrication facility 132. After transport 104, the BEOL process forms memory device die 150 or 151 on top of the base layer die 154. The memory device die 150 or 151 may be tested 174 and good and/or bad die identified. Subsequently, the wafer 171 can be singulated 178 to remove die 176 (e.g., the die 150 or 151 precision cut or sawed from wafer 171) to form individual memory device die 173. The die 173 may subsequently be assembled into packages 179 to form integrated circuits for mounting to a PC board or the like, for an electrical system (not shown). Packaged memory devices may undergo additional testing to ensure functionality and yield. In FIG. 1G it is important to note that wafers 170 and 171 are not two different wafers; rather, they are the same wafer at two distinctly different stages of a bifurcated fabrication process. The wafer is denoted as 170 during FEOL fabrication where die 154 is fabricated to include the active circuitry and the wafer is denoted as 171 during BEOL fabrication where the memory layer(s) are grown (e.g., fabricated on top of the die 154) to form the die 173. The use of two reference numerals 170 and 171, for the wafer illustrates the transformation from a partially completed FEOL die 154 to a completed BEOL die 173.

Figure 2A:
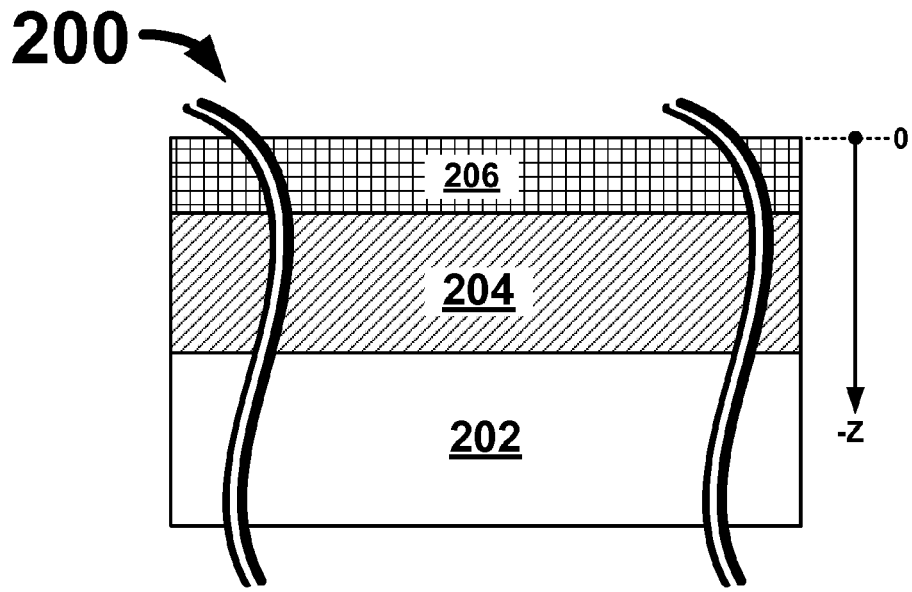
FIG. 2A depicts an exemplary cross-sectional view of a FEOL device.

FIG. 2A illustrates an exemplary cross-sectional view of a front-end-of-the-line (FEOL) device for device fabrication. Here, FEOL device 200 is shown vertically in cross-section, and includes substrate 202 and layers 204-206. In some examples, FEOL device 200 may be implemented similarly or substantially similar in function and structure to device 110 as shown and described in FIG. 1A. Here, FEOL device 200 may be a base device (e.g., base CMOS wafer) formed from FEOL processes performed, for example, by fabricator 102 (FIG. 1A) or fabrication facility 130 (FIG. 1B). Substrate 202 may be used to deposit one or more layers (e.g., 204-206). For example, layer 204 may represent interconnects that are used to couple a memory device formed from BEOL processes (not shown) to the substrate 202. In another example, layer 204 may also represent underlying metal, drivers, decoders, device circuitry, insulators, conductors, electronic devices (e.g., transistors, diodes, capacitors, and others), or other elements beyond those described here, without limitation. Further, layer 206 may be deposited over layer 204 using any type of material, including silicon dioxide ($SiO_2$), silicon (Si), or different materials to protect FEOL device 200 during transport.

In some examples, FEOL device 200 may be the resulting product of a first part of a semiconductor device fabrication process implemented using techniques such as those described herein. Any number of semiconductor fabrication processes may be performed to fabricate FEOL device 200 at a fabrication facility such as fabricator 102 (FIG. 1A). For example, depositing a base layer of metal, silicon, or other material on substrate 202 may be performed. As another example, underlying device drivers and circuitry or interconnects for coupling FEOL device 200 to logic or memory may also be patterned (i.e., formed) during the performance of FEOL processes. Further, after fabricator 102 has completed any number of FEOL processes, FEOL device 200 may be transported (e.g., 104), delivered, relocated, or otherwise moved to another fabrication facility, such as fabricator 106 (FIG. 1A), to perform any number of BEOL processes. As shown here, FEOL device 200 may include layers 202-206. As an example, layer 202 may be formed using silicon (Si), silicon dioxide ($SiO_2$), or layer 206 may be formed using material intended to protect the underlying substrate and materials deposited during the performance of FEOL processes during transport 104 (FIG. 1A). In other examples, the quantity, type, function, capabilities, and other aspects of the layers shown in FEOL device 200 may be varied and are not limited to any examples shown or described. In other examples, the elements shown and described may be implemented differently and are not limited to the examples or descriptions provided.

Figure 2B:
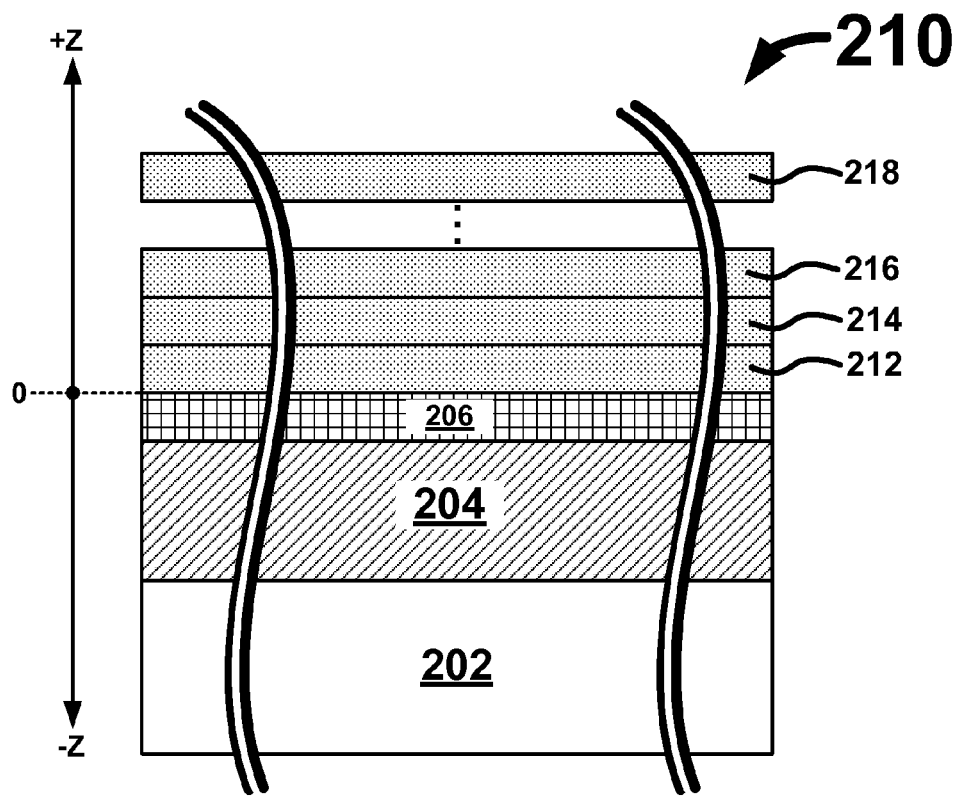
FIG. 2B depicts an exemplary cross-sectional view of a BEOL device fabricated on top of the FEOL device of FIG. 2A.

FIG. 2B illustrates an exemplary cross-sectional view of a BEOL device. Here, a cross-sectional view of BEOL device 210 is shown, including FEOL layers 202-206 and BEOL layers 212-218. In some examples, BEOL device 210 may be implemented similarly or substantially similar in function, pattern, layout, materials, or structure to device 112 as shown and described in FIG. 1A. In other examples, BEOL device 210 may be implemented differently and is not limited to the examples and descriptions provided. Here, layers 202-206 may represent layers of a semiconductor device (e.g., a memory, processor, or other type of electronic device) formed by FEOL processes, such as those described herein. Layers 212-218 may represent memory layers that are formed during BEOL processes. In other words, BEOL device 210 may be the resulting product of FEOL device 200 (FIG. 2A) after transport and performance of BEOL processes, as described herein, to create, form, manufacture, or otherwise fabricate a semiconductor device such as a processor chip, a memory chip, or the like. BEOL device 210 can include more or fewer BEOL layers than depicted in FIG. 2B.

In some examples, BEOL device 210 may be a cross-sectional view of a semiconductor device after both FEOL and BEOL processes have been performed (e.g., die 173 in FIG. 1G). As an example, the FEOL processes configured in preparation for subsequent fabrication of BEOL device 210 may be performed at a first fabrication facility such as fabricator 102 (FIG. 1A), and the BEOL processes to fabricate BEOL device 210 may be performed at a second fabrication facility such as fabricator 106 (FIG. 1A). As shown here, BEOL device 210 may include layers 202-206, which may be similar to those formed as described above in connection with FIG. 2A.

Referring back to FIG. 2B, layer 206 may have been deposited during the performance of FEOL processes in order to provide a shield layer or protective layer over FEOL device 200. In some examples, layer 206 may be "scrubbed" (i.e., removed using chemical etching or other processes) in order to expose layer 204, which, once exposed, may be suitable for bonding to other materials deposited over it. In other examples, layer 206 may be a layer of material (e.g., a dielectric material such as an oxide) that may be used as part of a completed electronic device and, once layers 212-218 are formed, enable a complete or substantially complete electronic device. Here, a passive third-dimensional memory array may be deposited over layer 206 using BEOL processes. Thereafter, fabricator 106 may implement any number of BEOL processes to complete fabrication of BEOL device 210. In other examples, the material, quantity, type, function, capabilities, and other aspects of the layers shown in BEOL device 210 may be varied and are not limited to any examples shown or described. In other examples, the elements shown and described may be implemented differently and are not limited to the examples or descriptions provided.

Figure 3A:
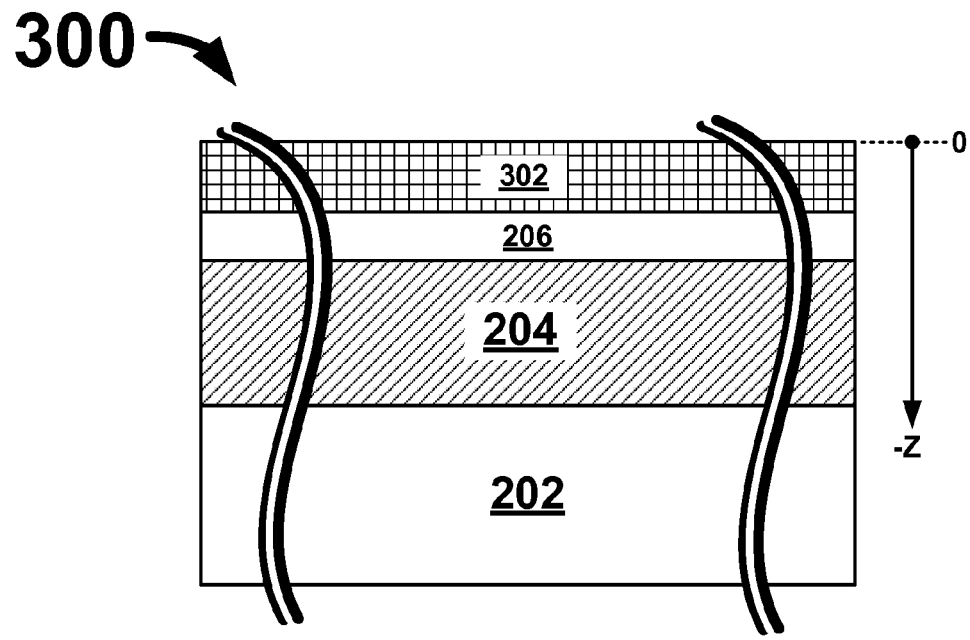
FIG. 3A depicts an alternative exemplary cross-sectional view of a FEOL device.

FIG. 3A illustrates an alternative exemplary cross-sectional view of a FEOL device 300. Here, FEOL device 300 is shown vertically in cross-section, and includes layers 202-206 and layer 302. In some examples, FEOL device 300 may be implemented similarly or substantially similar in function and structure to device 110 as shown and described in FIG. 1A. In other examples, FEOL device 300 may be implemented differently and is not limited to the examples and descriptions provided.

In some examples, FEOL device 300 may be the first part of a semiconductor device fabricated through the implementation of one or more FEOL processes. As an example, any number of FEOL processes to fabricate FEOL device 300 may be performed at a fabrication facility such as fabricator 102 (FIG. 1A). Further, after fabricator 102 has completed any number of FEOL processes, FEOL device 300 may be transported, delivered, relocated, or otherwise moved to another fabrication facility, such as fabricator 106 (FIG. 1A), to complete any number of BEOL processes. As shown here, FEOL device 300 may include layers 202-206 and layer 302. As an example, layers 202-206 and 302 may comprise silicon (Si), silicon dioxide ($SiO_2$), silicon nitride ($SiN_x$), zirconia ($ZrO_x$), silicate glass, suitable dielectric materials, passivation materials, metal, noble metals, or any type of material, which may include shield (i.e., protective) materials intended to protect FEOL device 300 during transport 104 (FIG. 1A). In other examples, the quantity, type, function, capabilities, and other aspects of the layers shown in FEOL device 300 may be varied and are not limited to any examples shown or described. In other examples, the elements shown and described may be implemented differently and are not limited to the examples or descriptions provided.

Figure 3B:
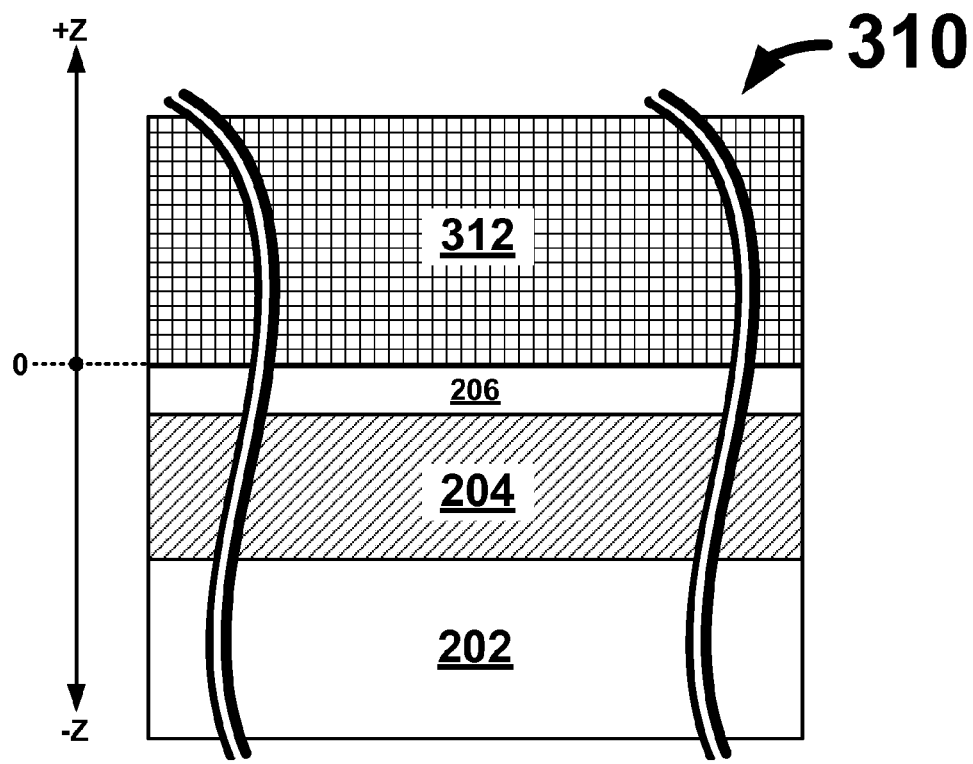
FIG. 3B depicts an alternative exemplary cross-sectional view of a BEOL device fabricated directly on top of the FEOL device of FIG. 3A.

FIG. 3B illustrates an alternative exemplary cross-sectional view of a BEOL device. Here, BEOL device 310 is shown vertically in cross-section, and includes layers 202-206, and layer 312. In some examples, BEOL device 310 may be implemented similarly or substantially similar in function and structure to device 112 as shown and described in FIG. 1A. In other examples, BEOL device 310 may be implemented differently and is not limited to the examples and descriptions provided.

In some examples, BEOL device 310 may be a semiconductor device fabricated through the implementation of one or more FEOL processes and one or more BEOL processes. As an example, FEOL processes to fabricate BEOL device 310 may be performed at a first fabrication facility such as fabricator 102 (FIG. 1A), and BEOL processes to fabricate BEOL device 310 may be performed at a second fabrication facility such as fabricator 106 (FIG. 1A). As shown here, BEOL device 310 may include layers 202-206 and layer 302 (FIG. 3A). As an example, as part of the BEOL processing, a shield layer fabricated FEOL (e.g., layer 302 in FIG. 3A) may be removed by scrubbing (e.g., using a process such as chemical mechanical planarization—CMP) to expose the surface of layer 206. Thereafter, fabricator 106 may implement any number of BEOL processes to complete fabrication of BEOL device 310. In some examples, layer 206 may comprise any number of metal layers with circuit interconnection. In other examples, the quantity, type, function, capabilities, and other aspects of the layers shown in BEOL device 310 may be varied and are not limited to any examples shown or described. In other examples, the elements shown and described may be implemented differently and are not limited to the examples or descriptions provided.

Figure 4:
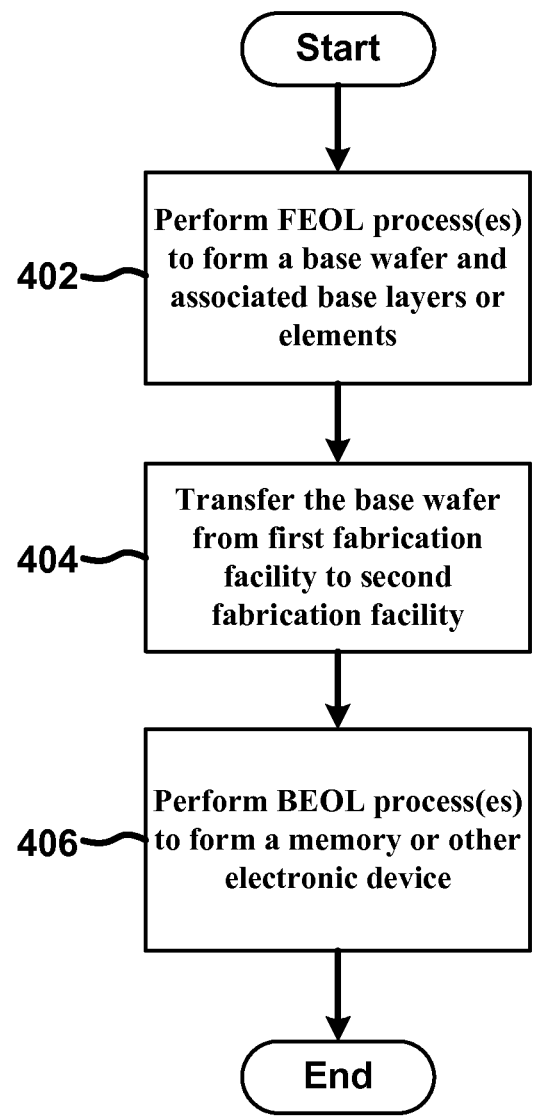
FIG. 4 depicts an exemplary process for device fabrication.

FIG. 4 illustrates an exemplary process 400 for device fabrication. Here, at a stage 402, one or more FEOL processes may be performed at a first fabrication facility to form a base wafer associated with a memory device. The base wafer including a plurality of FEOL die (e.g., partially completed die 154 on wafer 170 in FIG. 1G). Using older fabrication equipment that, for example, may fabricate feature sizes larger than those that newer fabrication equipment are capable of fabricating may be used to perform FEOL processes as described herein. By using older equipment, service lives are prolonged, full or greater depreciation of the equipment may be realized with additional revenue generation resulting from the fabrication of additional products (e.g., device 301 (FIG. 3A)), leading to greater overall industry utilization and profit generation. In some examples, one or more FEOL processes may include forming a substrate, depositing metal layers, testing, providing a shield layer, or others, without limitation. At a stage 404, the base wafer is transferred from the first fabrication facility to a second fabrication. At a stage 406, one or more BEOL processes are performed at a second fabrication facility to form a memory device directly on top of die 154 on the FEOL base wafer (e.g., completed die 173 from wafer 171 in FIG. 1G or die 173 in FIGS. 8A and 8B). The one or more BEOL processes may include scrubbing a shield layer, depositing metal layers, testing, forming one or more connections to create a memory array, or the like. Additionally, the BEOL processes can include but are not limited to singulating die from the wafer, testing die on the wafer, packaging singulated die, and testing packaged IC's. In other examples, the above-described process may be varied and is not limited to the techniques provided. The above-described process may be varied in order, function, processes, steps, or other aspects and are not limited to the examples shown and described.

Figure 5:
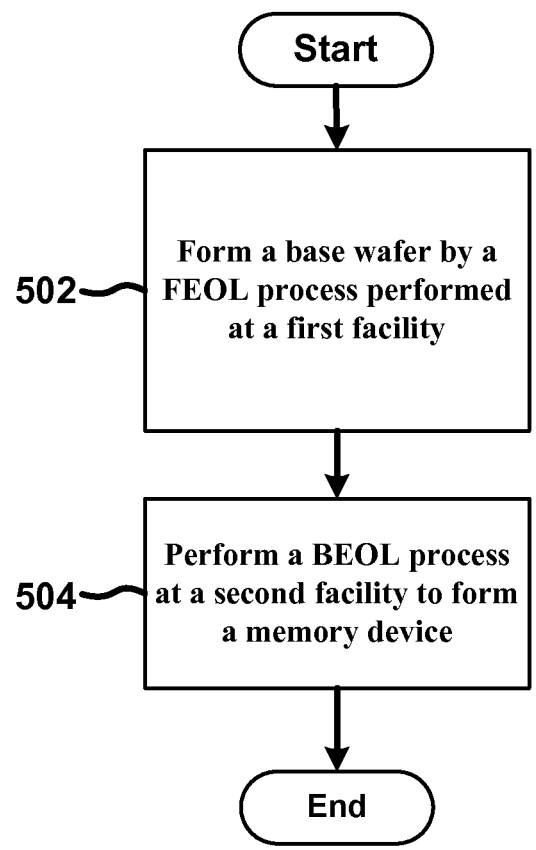
FIG. 5 depicts an alternative exemplary process for device fabrication.

FIG. 5 illustrates an alternative exemplary process 500 for device fabrication. Here, at a stage 502, a first part of a memory device may be formed at a first fabrication facility, the first part of the memory device comprising a base wafer formed by one or more FEOL processes. As one example, the first part at the stage 502 can include fabricating CMOS circuitry on the base layer (e.g., die 154 in FIG. 1G), at least a portion of the CMOS circuitry configured to perform data operations on one or more layers of memory that will be subsequently formed over each die as part of a BEOL process. At a stage 504, one or more BEOL processes may be performed at a second fabrication facility to form a memory device (e.g., die 173 in FIGS. 1G, 8A, and 8B), the one or more BEOL processes comprising forming the memory device by depositing one or more memory layers on the base wafer.

Figure 6:
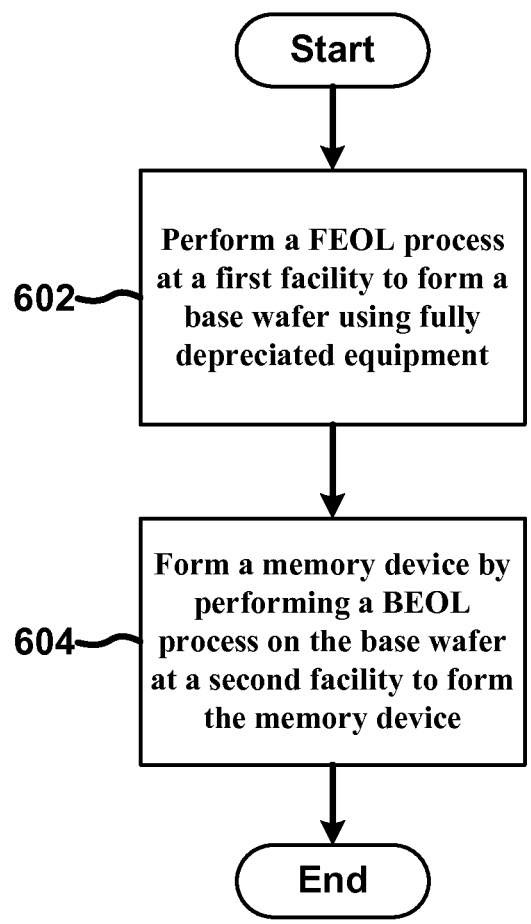
FIG. 6 depicts another alternative exemplary process for device fabrication.

FIG. 6 illustrates another alternative exemplary process 600 for device fabrication. Here, at a stage 602, one or more FEOL processes may be performed to form a base wafer (e.g., wafer 170 with die 154 in FIGS. 1G and 9), the base wafer being formed at a first fabrication facility using fully depreciated fabrication equipment. At a stage 604, a memory device (e.g., wafer 171 with die 173 in FIGS. 1G, 8A, 8B, and 9) may be formed at a second fabrication facility, the second fabrication facility performing one or more BEOL processes to form the memory device. Here, the memory device comprises a completed die (e.g., die 173) that can be subsequently singulated from the wafer and packaged as was described above to form a packaged integrated circuit (IC) device (e.g., 873 and 883 in FIGS. 8A, 8D, and 9).

In some applications it may be desirable to incorporate embedded non-volatile memory in an IC such as an application specific integrated circuit (ASIC), a microprocessor (μP), a digital signal processor (DSP), a microcontroller (μC), a programmable logic device such as a FPGA, or an embedded controller, for example. Typical uses for the embedded non-volatile memory include but are not limited to buffers, command buffers, page buffers, data input and/or output buffers, registers, block registers, register files, cache (e.g., L2), instruction cache and/or data cache (e.g., L1), a translation look-aside buffer (TLB) (e.g., for instructions and/or data), stack memory, program memory, data memory, integer registers, on-chip trimming, on-chip encryption keys, on-chip firmware storage, just to name a few.

Figure 7:
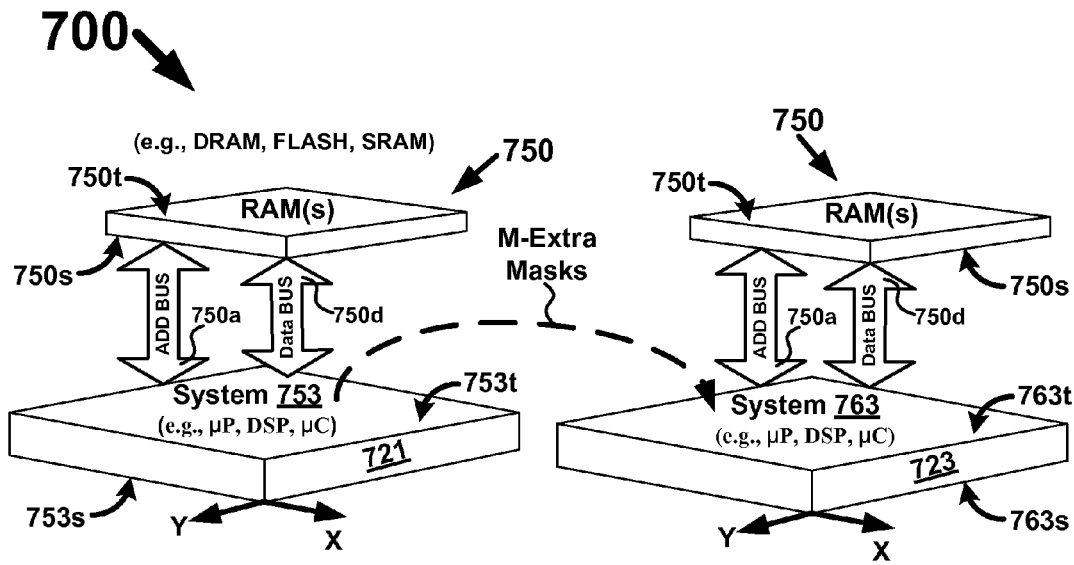
FIG. 7 depicts a conventional FEOL only IC that includes embedded non-volatile memory and in communication with a conventional FEOL only RAM IC.

Turning now to FIG. 7, a conventional implementation 700 of an IC that includes embedded non-volatile memory includes a system 753 formed on a substrate 721 (e.g., a silicon die) having top and bottom surfaces 753t and 753s. The system 753 can be any type of electronic device that requires embedded non-volatile memory such as a microprocessor (μP), a digital signal processor (DSP), a microcontroller (μC), a FPGA, just to name a few. Here, the embedded non-volatile memory is fabricated directly on the substrate 721 along with the other circuitry for system 753. To add the embedded non-volatile memory the X-Y dimensions (i.e., the area) of the substrate must be increased to accommodate the silicon resources required by the embedded non-volatile memory. Moreover, the addition of the embedded non-volatile memory requires generating additional photolithographic mask layers to fabricate the embedded non-volatile memory. The increase in die size reduces the number of die that can be fabricated on a wafer and increases the cost of the resulting IC because the cost of an IC is proportional to the area of the die the IC is formed on.

Accordingly, in FIG. 7, to add the embedded non-volatile memory requires M-Extra Mask and the additional costs to fabricate each additional mask plus other costs to fabricate the embedded non-volatile memory on the substrate 721. For example, as many as eight additional masks (e.g., M=8) may be required to implement the embedded non-volatile memory on substrate 721. Therefore, system 763 in FIG. 7 represents the system 753 after embedded non-volatile memory has been added, with system 763 having a larger die area and a higher manufacturing cost due to the addition of the embedded non-volatile memory as compared to system 753 without embedded non-volatile memory. Here, the X-Y dimensions of die 723 are larger than the X-Y dimensions of die 721. Consequently, there are disadvantages to adding embedded non-volatile memory to the die of a system including increased die size and die cost, costs for additional mask sets, additional fabrication steps and their associated costs, and costs associated with defects in the embedded non-volatile memory that reduce the number of good die per wafer.

Figure 8:
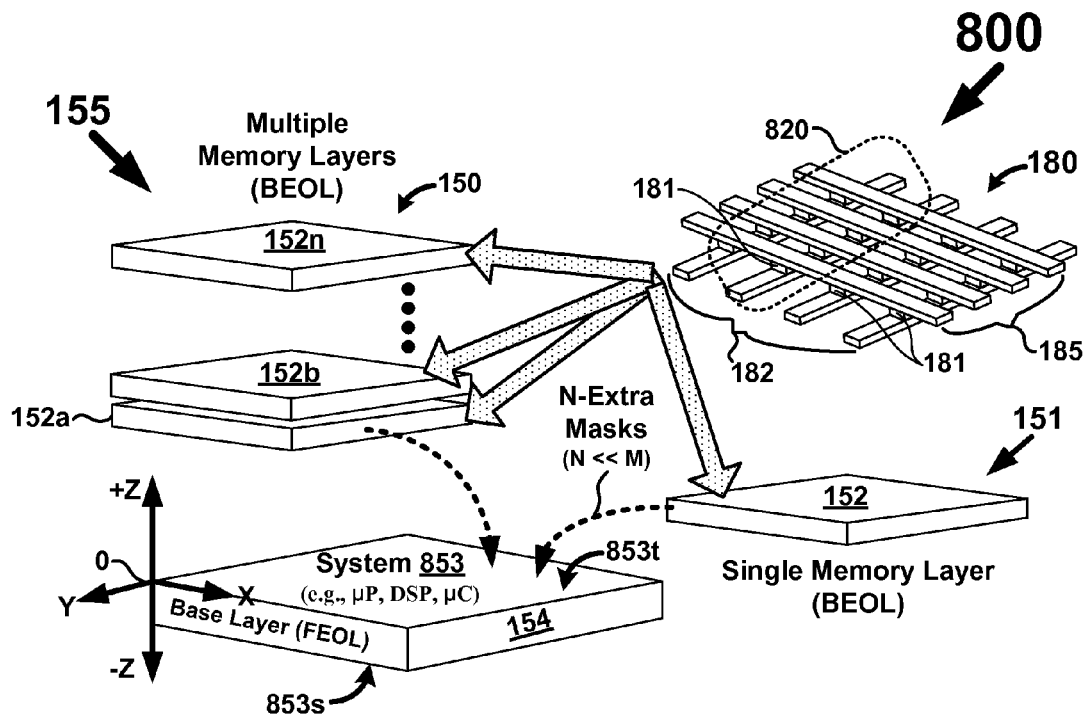
FIG. 8 depicts an IC including FEOL circuitry and one or more layers of BEOL memory fabricated on top of the FEOL circuitry with at least one of the layers of BEOL memory including at least one BEOL embedded non-volatile memory.

Moving on to FIG. 8, using the FEOL and BEOL device fabrication paradigm described herein, implementation 800 includes a system 853 having active circuitry fabricated FEOL on base layer 154 and the system 853 includes embedded non-volatile memory that is fabricated BEOL vertically above base layer 154 in one layer 152 or in multiple layers 152a, 152b, . . . 152n layers of memory. Unlike the conventional implementation 700 depicted in FIG. 7, the area of base layer 154 (e.g., the X-Y dimensions) is not increased by the addition of the embedded non-volatile memory because the embedded non-volatile memory is fabricated BEOL after the FEOL fabrication is completed and is positioned over the base layer 154 and therefore does not take up space (e.g., silicon area) on the base layer 154. As an example, the system 853 can be a microprocessor (µP) that requires embedded non-volatile memory in the form of several different types of non-volatile registers and buffers in its architecture, such as a TLB, L1 cache, L2 cache, data buffers, command buffers, and page buffers, just to name a few. Instead of fabricating those registers and buffers on the substrate (e.g., as in system 763 of FIG. 7), those non-volatile registers and buffers are fabricated BEOL and are electrically coupled with the relevant FEOL circuitry configured to perform data operations on the non-volatile registers and buffers.

In implementation 800, the addition of the embedded non-volatile memory BEOL on top of the FEOL base layer 154 requires fewer masks than the implementation 700 of FIG. 7. Here, N-Extra Masks are required to fabricate the embedded non-volatile memory BEOL, where N can be three masks (e.g., N=3). In contrast, the implementation 700 of FIG. 7 can require eight extra masks (e.g., M=8) to implement the embedded non-volatile memory FEOL on the substrate 723. Therefore, one advantage to the BEOL implementation of embedded non-volatile memory in 800 is that fewer masks are required (e.g., N<<M) and the cost savings associated with using fewer masks. For example, the cost for each mask in a set of masks required to fabricate a complete state-of-the-art IC can be $100K or more per mask. Therefore, using 3 masks instead of eight eliminates five masks and can provide a significant cost savings.

Implementation 800 allows for great flexibility in architecting the layout of the BEOL embedded non-volatile memory in the memory layer(s). As one example, one or more portions 820 of non-volatile array 180 can be used as embedded non-volatile memory by the system 853. The address space associated with the memory cells 181 in portion 820 of array 180 can be configured by the system 853 (e.g., using hardware, software, or firmware) for dedicated use as a register, buffer, or the like. As another example, the BEOL embedded non-volatile memory can be a small non-volatile array 180 configured to store the amount of data required by the system 853. For example, if the system 853 operates on a 64-bit word and requires a data buffer that stores 16 words, the small non-volatile array 180 can be configured to be an array size of 16×64 (e.g., 16 row conductive array lines 182 by 64 column conductive array lines 185). As yet another example, each layer of memory can be partitioned such that some portions of a layer are configured for use as non-volatile RAM storage and other portions are configured for use as embedded non-volatile memory. The embedded non-volatile memory can be of different sizes and configurations and can be disposed on a single layer of memory 152 or among multiple layers of memory 152a, 152b, . . . 152n. Therefore, if the system 853 requires any combination of DRAM, SRAM, or FLASH for RAM data storage and also requires embedded non-volatile memory, both requirements can be met by fabricating those memories BEOL above the base layer 154 in one or more layers (152, 152a, 152b, . . . 152n) of BEOL memory.

Referring again to FIG. 7, the conventional implementation 700 may also require any combination of DRAM, SRAM, or FLASH for RAM data storage and also require embedded non-volatile memory. However, the RAM(s) are typically fabricated as one or more separate IC's 750 and are mounted on the same PC board as the system 763 and electrically coupled using PC board traces to communicate address 750a and data 750b signals and other control signals (not shown). Those RAM IC's require additional PC board space to accommodate their respective packages and PC board traces and incur additional costs due to the cost of the IC's and their packaging.

Figure 7A:
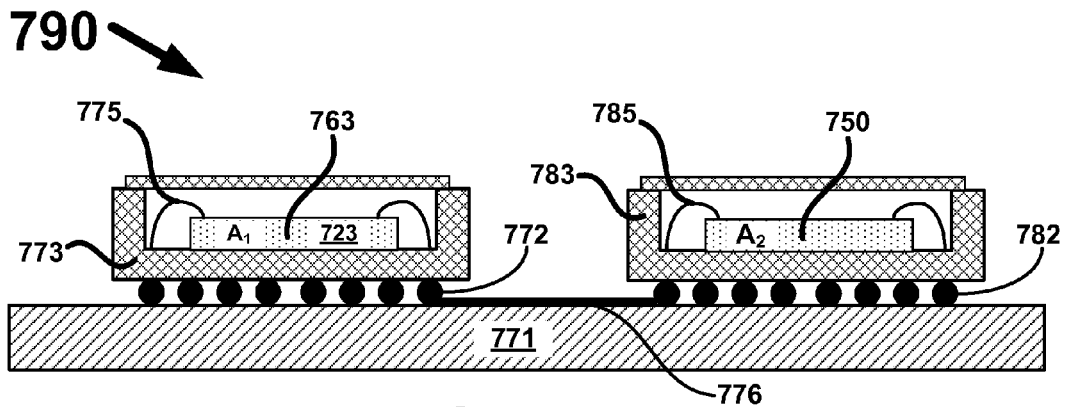
FIG. 7A depicts cross-sectional views of a conventional packaged FEOL only IC and a conventional packaged FEOL only RAM IC that are mounted on a PC board and in electrical communication with each other.

Turning now to FIG. 7A, the conventional implementation 700 of FIG. 7 can be depicted in cross-sectional view as conventional implementation 790 where system 763 and one or more RAM(s) 750 are positioned in a packages (773, 783), wire bonded (775, 785), mounted to a PC board 771 using solder balls (772, 782) and electrically coupled with each other using one or more PC board traces 776. Not withstanding the area taken up by their respective packages (773, 783) the die 721 for system 763 and RAM(s) 750 have die areas of $A_1$ and $A_2$ such that implementation 790 requires at minimum an area on PC board 771 of $A_M = A_1 + A_2$.

Figure 8A:
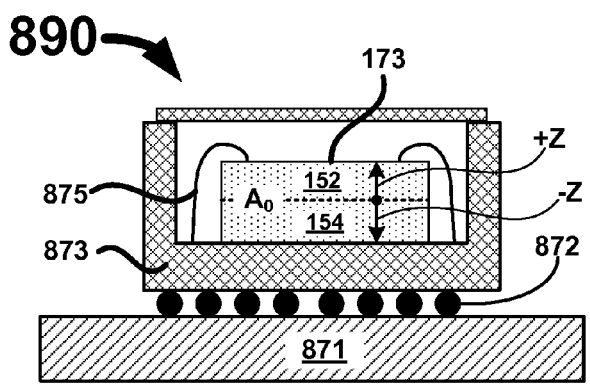
FIG. 8A depicts a cross-sectional view of a packaged IC including a die having a FEOL circuitry portion and a BEOL memory portion comprising a single layer of memory.

Attention is now directed to FIG. 8A where a cross-sectional view, denoted as implementation 890, illustrates how die area and PC board space can be reduced by using FEOL processing for active circuitry and BEOL processing for non-volatile memory (e.g., RAM) and/or embedded non-volatile memory. Die 173 is positioned in package 873, wired bonded 875, and mounted to a PC board 871 using solder balls 872. Active circuitry for system 853 of FIG. 8 is fabricated FEOL on base layer 154 along the −Z axis and the non-volatile RAM(s) and/or embedded non-volatile memory are fabricated BEOL above the base layer 154 along the +Z axis. Area $A_0$ of die 173 is less than the area $A_1$ because unlike the system 763 of FIG. 7A, the non-volatile memory is implemented in memory layer 152 and therefore does not take up area on the base layer 154. Furthermore, because the non-volatile memory is implemented in memory layer 152 the area $A_2$ for RAM(s) 750 is eliminated and less PC board area is required for PC board 871. PC board trace 776 is eliminated because electrical communication between system 853 and the memory(s) in layer 152 are accomplished using an inter-level interconnect layer that electrically couples the active circuitry in base layer 154 with the memory(s) in layer 152.

Figure 8B:
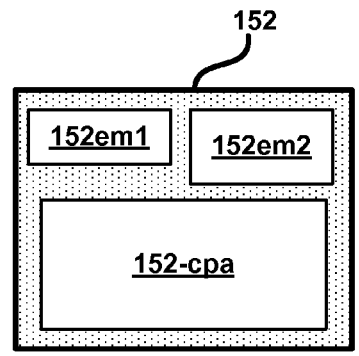
FIG. 8B depicts a top-plan view of an example configuration for the IC of FIG. 8A where the BEOL memory portion includes at least one BEOL embedded non-volatile memory and at least one cross-point array.

In FIG. 8B, a top plan view depicts one example of a configuration for BEOL memory layer 152. Memory layer 152 includes three portions or partitions: a cross-point memory array 152-cpa; a first embedded non-volatile memory 152em1; and a second embedded non-volatile memory 152em2. Embedded non-volatile memories 152em1 and 152em2 can be configured as cross-point arrays or have an application specific configuration that is not necessarily based on cross-point array architecture. The size and layout of the memories 152-cpa, 152em1, and 152em2 will be application dependent. For example, memory 152-cpa can be 64-Gigabit two-terminal cross-point memory array configured as general RAM storage for system 853 and/or some other system in electrical communication with system 853, memory 152*em*1 can be configured as a dedicated L1 cache for system 853 and memory 152*em*2 can be configured as a dedicated L2 cache for system 853.

In some applications it may be desirable to implement multiple layers of BEOL memory. The memory layers can include one or more embedded non-volatile memories only, non-volatile RAM only, both embedded non-volatile memory(s) and non-volatile RAM(s), or any combination of those memory types.

Figure 8C:
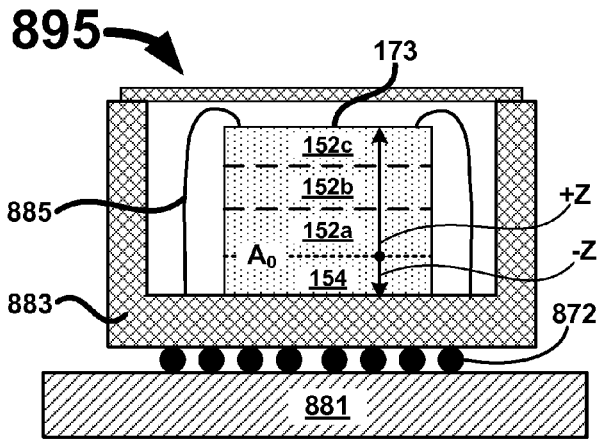
FIG. 8C depicts a cross-sectional view of a packaged IC including a die having a FEOL circuitry portion and a BEOL memory portion comprising three vertically stacked layers of memory.

Reference is now made to FIG. 8C where a cross-sectional view of an implementation 895 illustrates vertically stacked memory layers. A die 173 includes FEOL base layer 154 and three layers of BEOL memory 152*a*, 152*b*, and 152*c* vertically fabricated BEOL above the base layer 154 along the +Z axis. Die 173 is positioned in package 883, is wire bonded 885, and is mounted to PC board 881 using solder balls 872. Die 173 can have the same area $A_0$ that is less than the area $A_1$ for the same reasons as described above in reference to FIG. 8A. In FIG. 8B, the volume of die 173 has increased slightly due to the increase in the height of the die 173 in the +Z direction due to the multiple memory layers as compared to the die 173 of FIG. 8A having only a single memory layer.

Figure 8D:
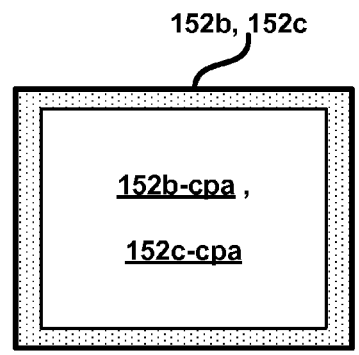
FIG. 8D depicts a top plan view of an example configuration for the two uppermost of the vertically stacked layers of memory of FIG. 8C.

Moving on to FIG. 8D, one example of memory partitioning among the layers 152*b* and 152*c* and includes cross-point memory arrays for non-volatile RAM data storage denoted as 152*b*-*cpa* for layer 152*b* and 152*c*-*cpa* for layer 152*c*. Layer 152*a* can be configured as depicted in FIG. 8A with cross-point array 152-*cpa* and embedded non-volatile memories 152*em*1 and 152*em*2. The actual configuration for the layers 152*a*-*c* will be application dependent and implementation 895 can include more or fewer layers of memory than depicted in FIG. 8C and can include any combination of embedded non-volatile memories and non-volatile RAM disposed in the layers of memory.

Figure 9:
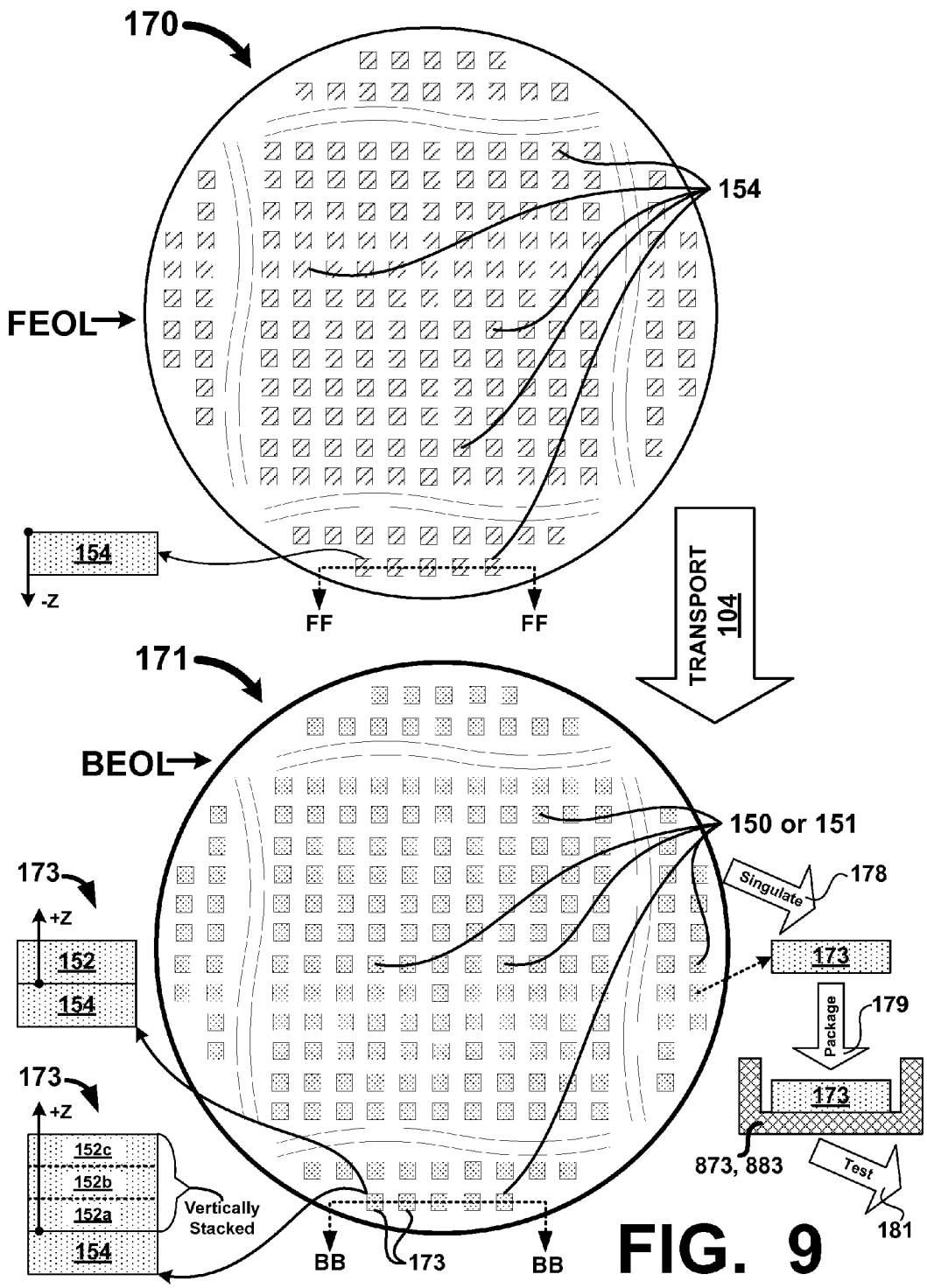
FIG. 9 is a top plan view depicting a transformation of a die as the die moves from FEOL processing where circuitry is fabricated on the die to BEOL processing where one or more layers of memory are fabricated directly on the die and above the FEOL fabricated circuitry.

Attention is now directed to FIG. 9, where the transformation of a FEOL processed wafer 170 to a BEOL processed wafer 171 is depicted. FEOL wafer 170 includes a plurality of the aforementioned die 154. A cross-sectional view of the die 154 is depicted along a line FF-FF to illustrate that the base layer is formed along the –Z axis and is not a finished die until the BEOL processing has fabricated the memory layer(s) on top of the base layer 154 along the +Z axis. After transport 104, the FEOL wafer 170 is transformed into wafer 171 by BEOL processing to form completed die 173 that includes one layer of memory 152 or multiple layers of memory 152*a*, 152*b*, 152*c* . . . 152*n*, fabricated above base layer die 154 along the +Z axis as depicted in cross-sectional view along a line BB-BB. Upon completion of BEOL fabrication, wafer 171 can undergo additional fabrication steps such as singulating 178 (e.g., sawing) die 173 from the wafer 171, packaging 179 the singulated die 173 into packages (e.g., 873 or 883), and testing 181 packaged die 173. The die 173 can also be tested for yield and/or functionality prior to being singulated from the wafer 171. For example, prior to packaging 179, it may be desirable to test the die 173 for functionality and yield of the memory layer(s) that were fabricated BEOL to determine which good functional die 173 to package 179. In some applications, the singulating, packaging, testing, or other processes can be part of the BEOL process and those processes can be accomplished by fabricator 106, fabrication facility 132, or by a third party. Similarly, prior to transport 104, testing or other processes can be performed by fabricator 102, fabrication facility 130, or a third party.

Figure 10:
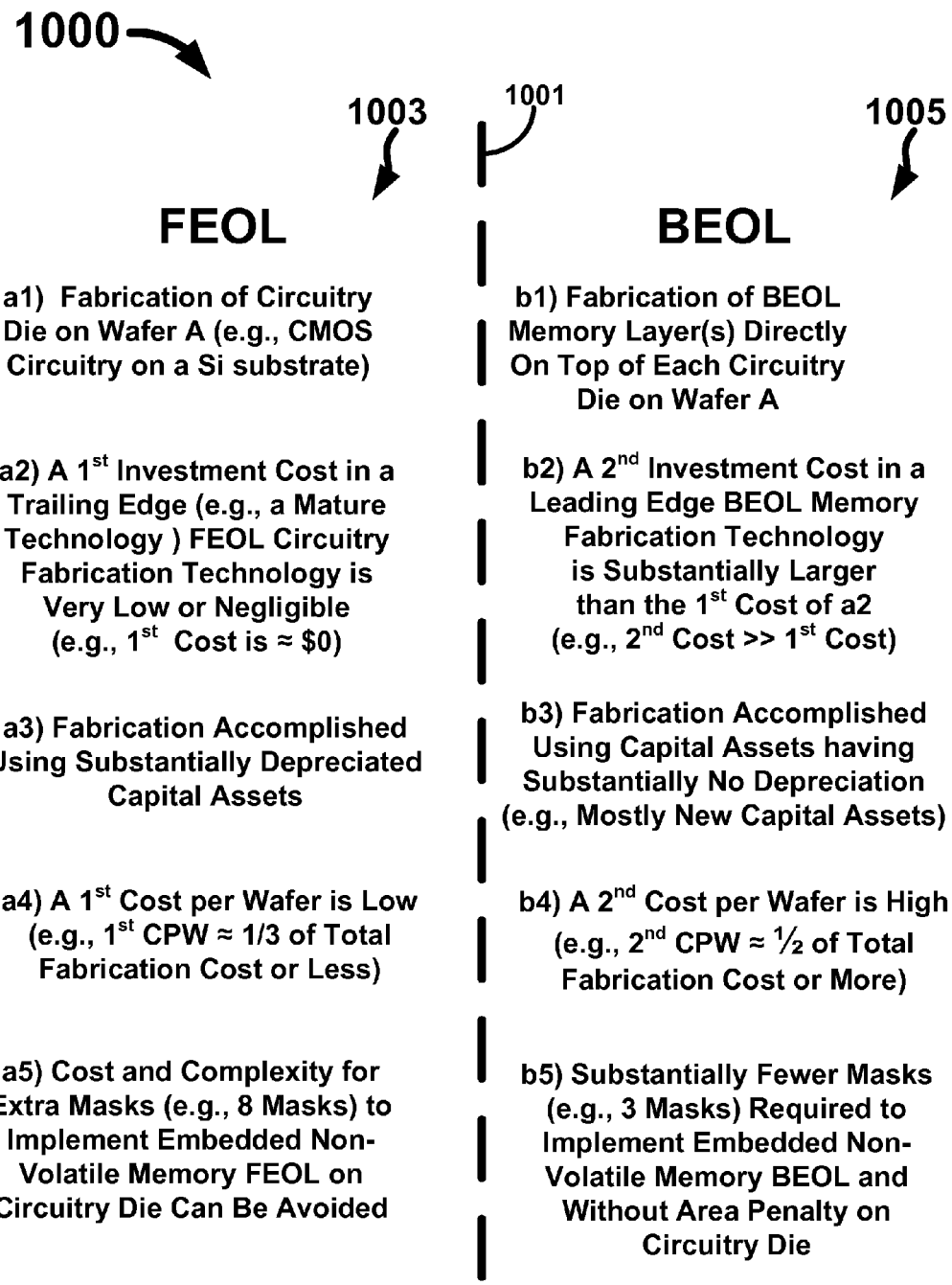
FIG. 10 depicts key differences and advantages of an IC die processed using FEOL fabrication for circuitry and BEOL fabrication for one or more memory layers.

Turning now to FIG. 10, a chart 1000 depicts key differences and advantages for processing an IC die (e.g., die 173) using FEOL fabrication 1003 for active circuitry and BEOL fabrication 1005 for one or more layers of memory. A line 1001 denotes a demarcation or transition point between FEOL fabrication 1003 and BEOL fabrication 1005. As one example, line 1001 can comprise the transport 104. Focusing first on the FEOL fabrication 1003, at a1 FEOL fabrication of circuitry die on a wafer (e.g. Wafer A) occurs as described above. At a2 a trailing edge FEOL fabrication technology having a first investment cost ($1^{st}$ Cost) that is very low or is negligible is used for fabricating the circuitry die. For example, the technology used for the fabrication at a1 can be a mature IC fabrication process for which the $1^{st}$ cost is approximately zero dollars. At a3 the fabrication can be accomplished using capital assets selected based on their status as substantially depreciated capital assets (e.g., either fully depreciated or almost fully depreciation in their capital value). At a4 a first cost per wafer ($1^{st}$ CPW) is low due in substantial part to the use of the trailing edge fabrication technology of a2 and the depreciated capital assets of a3. As one example, the $1^{st}$ CPW can be approximately ⅓ of a total fabrication cost or less, where the total fabrication cost can include the $1^{st}$ CPW and a cost per wafer for the BEOL fabrication 1005 as will be described below. At a5 the costs and complexity associated with using extra masks for implementing embedded non-volatile memory on the FEOL circuitry die (e.g., die 154) can be avoided because fewer masks (e.g., 3 masks vs. 8 masks) are used to implement the embedded non-volatile memory as part of the BEOL fabrication 1005.

Focusing now on the BEOL fabrication 1005, at b1 one or more memory layers are fabricated directly on top of the circuitry die of a1. At b2 a second investment cost ($2^{nd}$ Cost) in a leading edge BEOL memory fabrication technology can be substantially larger than the $1^{st}$ Cost of a2 (e.g., $2^{nd}$ Cost>>$1^{st}$ Cost). For example the $2^{nd}$ Cost can be several hundreds of million dollars or several billions of dollars more; whereas, the $1^{st}$ Cost can be approximately zero dollars or only a few million dollars. At b3 the BEOL fabrication is accomplished using capital assets having substantially no depreciation (e.g., little or no depreciation in their capital value). For example, the capital assets can be recently purchased capital equipment. The recently purchased capital equipment can be purchased new or can be purchased used; however, for the purchasing entity, the capital equipment is new in the sense that it has not suffered any substantial depreciation in its capital value. At b4 a second cost per wafer ($2^{nd}$ CPW) is high due in substantial part to the use of the leading edge fabrication technology of b2 and the substantially no depreciation of capital assets of b3. As one example, the $2^{nd}$ CPW can be approximately ½ of the total fabrication cost or more. At b5, if embedded non-volatile memory is to be implemented, then the aforementioned fewer masks (e.g., 3 masks) can be generated to implement the embedded non-volatile memory and because the embedded non-volatile memory is fabricated BEOL on top of the circuitry die of a1, there is no area penalty on the circuitry die itself.

The term capital assets as used herein includes any capital equipment used in the FEOL 1003 and/or BEOL 1005 fabrication and can include but is not limited to deposition equipment, lithography equipment, furnaces, wet and dry etching equipment, automatic test equipment, physical analysis equipment, failure analysis equipment, inspection equipment, wafer handling equipment, clean rooms, facilities infrastructure, robotics equipment, computers, workstations, IT infrastructure, test equipment, CAD or other software, CMP equipment, buildings, facilities, and structures used in the fabrication process, just to name a few. As an example of the differences between the capital assets for a3 and b3, the capital assets for a3 can be a mature technology configured for fabricating FEOL circuitry having feature sizes of 90 nm or larger and the capital assets for b3 can be configured for fabricating BEOL memory layer(s) having feature sizes of 45 nm or less. The total fabrication cost may not necessarily be the sum of the $1^{st}$ Cost and the $2^{nd}$ CPW (e.g., Total Fabrication Cost≠$1^{st}$ Cost+$2^{nd}$ CPW).

Figure 11A:
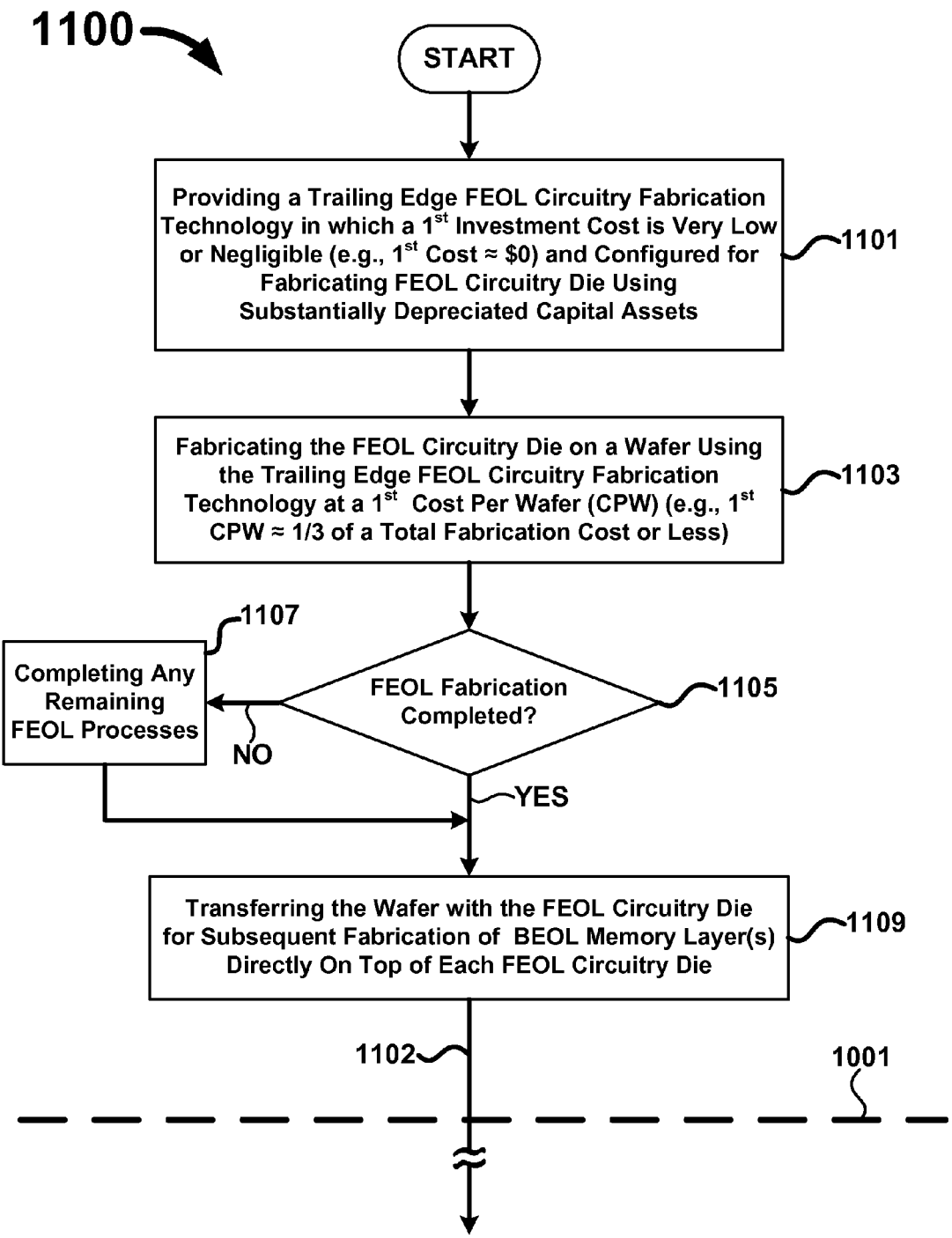
FIG. 11A depicts an exemplary process for fabricating a FEOL circuitry die.
Figure 11B:
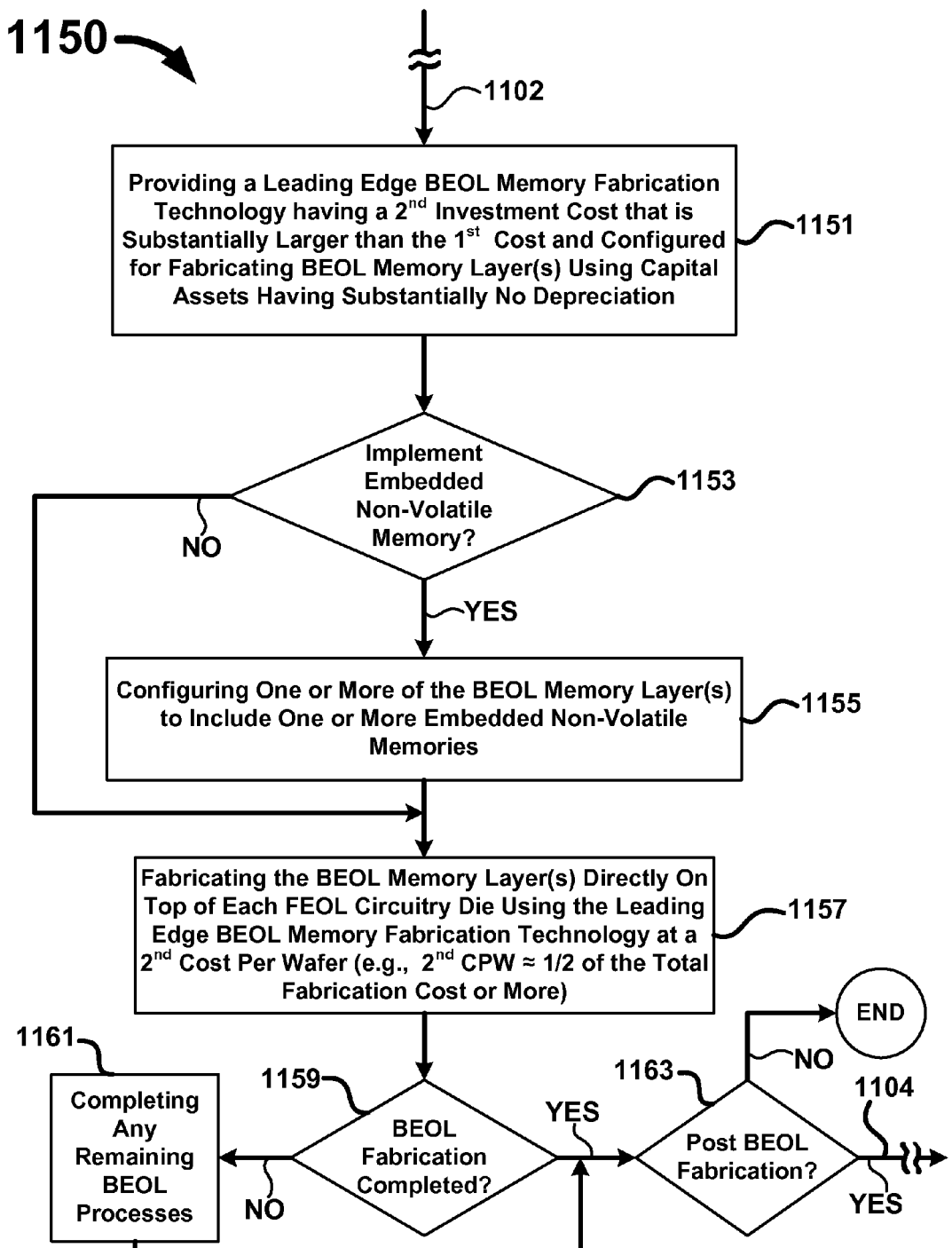
FIG. 11B depicts an exemplary process for fabricating one or more BEOL memory layers on the FEOL circuitry die of FIG. 11A.

FIGS. 11A and 11B depict two parts of a bifurcated IC fabrication process 1000 where a first part comprises FEOL processing 1100 to form a FEOL circuitry die and a second part which comprises BEOL memory layer processing 1150 on the FEOL circuitry die fabricated in the first part. Prior to the process 1000, one skilled in the art will appreciate that system to be fabricated by the process 1000 will have already been architected; synthesized, simulated, artwork generated, placed and routed, mask sets generated, etc. Two separate flow diagrams are depicted to illustrate the bifurcated strategy of forming the FEOL base wafer using a trailing-edge low cost technology configured for forming active circuitry in a first fabrication facility followed by BEOL memory layer fabrication directly on top of the base wafer using a leading-edge higher cost technology configured for passive memory formation in a second fabrication facility. In some applications the first and second fabrication facilities are different facilities and/or manufacturing entities and in other applications the first and second fabrication facilities are the same facility and/or manufacturing entity.

Reference is now made to FIG. 11A, where an exemplary process 1100 for fabricating a FEOL circuitry die (e.g., die 154) includes at a stage 1101 providing a trailing edge FEOL circuitry fabrication technology having a first investment cost that is very low or negligible (e.g., $1^{st}$ Cost in a2 in FIG. 10) and the trailing edge FEOL circuitry fabrication technology is configured for fabricating the FEOL circuitry die using substantially depreciated capital assets (e.g., a3 of FIG. 10). At a stage 1103, the FEOL circuitry die is fabricated on a wafer using the trailing edge FEOL circuitry fabrication technology at a first cost per wafer (e.g., $1^{st}$ CPW of a4 in FIG. 10). Preferably, the $1^{st}$ CPW is the smallest percentage of a total fabrication cost such as approximately ⅓ of the total fabrication cost or less. At a stage 1105 a determination can be made as to whether or not the FEOL fabrication is completed. If FEOL fabrication is completed, then the YES branch can be taken to a stage 1109, or if the FEOL fabrication is not completed, then the NO branch can be taken to a stage 1107. If the NO branch is taken, then any remaining FEOL processes can be completed and the process resumes at the stage 1109. Examples of processes that can be executed at the stage 1107 include but are not limited to testing the wafer for functional die, preparing the wafer for transport 104, identifying good die and failed die, determining yield on the FEOL circuitry die, just to name a few. At the stage 1109 the wafer is transferred (e.g., the transport 104) for subsequent fabrication one or more BEOL memory layers directly on top of each of the FEOL circuitry die. After stage 1109 processing of the wafer continues 1102 and is depicted in FIG. 11B where the demarcation line 1001 indicates a transition from FEOL circuitry processing 1100 to BEOL memory layer processing 1150.

Turning now to FIG. 11B, a stage 1151 includes providing a leading edge BEOL memory fabrication technology having a second investment cost (e.g., $2^{nd}$ Cost of b2 in FIG. 10) that is substantially larger than the $1^{st}$ Cost and the leading edge BEOL memory fabrication technology is configured for fabricating one or more BEOL memory layers using capital assets having substantially no depreciation (e.g., b3 of FIG. 10). The providing at the stage 1101 of FIG. 11A and the providing at the stage 1151 of FIG. 11B can be by the same business entity or different business entities. Furthermore, any of those business entities can enlist third parties to perform some or all of the fabrication steps depicted in FIGS. 11A and 11B.

At a stage 1153 a determination is made as to whether or not embedded non-volatile memory is to be implemented in one or more of the BEOL memory layers. If the NO branch is taken, then the processing continues at a stage 1157. If the YES branch is taken, then at a stage 1155 one or more of the BEOL memory layers is configured to include one or more embedded non-volatile memories. The configuration at the stage 1155 can include generating the mask sets (e.g., N-Extra Masks in FIG. 8) necessary for implementing the embedded non-volatile memories. In that the BEOL memory layers may be any combination of memory types such as cross-point array only, embedded non-volatile memory only, or both embedded non-volatile memories and cross-point array, the necessary masks for any of those combinations can be generated as part of the stage 1155 or prior to the state 1155. For example, in a BEOL memory configuration in which there are four layers of BEOL memory, a first BEOL memory layer can be configured to include three embedded non-volatile memories and two cross-point memory arrays, a second BEOL memory layer can be configured to include five embedded non-volatile memories and one cross-point memory array, a third BEOL memory layer can be configured to include a single cross-point memory array, and a fourth BEOL memory layer can be configured to include a single cross-point memory array. The first through fourth BEOL memory layers are vertically stacked one upon the other. The embedded non-volatile memories can be placed in the lower two layers (i.e., the first and second layers) so that they are closer to the FEOL circuitry in the base layer (e.g., layer 154) thereby reducing the length of routed interconnect lines from the base layer to the first and second layers with a concomitant reduction in propagation delays for signals communicated along the routed interconnect lines. The cross-point memory arrays in the layers can be configured to emulated different types of RAM, such a SRAM in the first layer, FLASH in the second layer, and DRAM in the third and fourth layers.

At a stage 1157, the one or more BEOL memory layers are fabricated directly on top of each FEOL circuitry die using the leading edge BEOL memory fabrication technology and at a second cost per wafer (e.g., $2^{nd}$ CPW of b4 in FIG. 10). In that the capital assets used for the leading edge BEOL memory fabrication technology have substantially no depreciation, the $2^{nd}$ CPW can be a greater percentage of the total fabrication cost and can be approximately ½ the total fabrication cost or more.

At a stage 1159 a determination is made as to whether or not BEOL fabrication is complete. If the NO branch is taken, then at a stage 1161, any remaining BEOL processes are completed and upon completion processing continues at a stage 1163. If the YES branch is taken, then the processing continues at the stage 1163 where a determination is made as to whether or not any post BEOL processing is required. If the NO branch is taken, then processing terminates. If the YES branch is taken, then post BEOL processing continues at 1104. As one example, if BEOL processing 1150 is completed, whole wafers can be shipped to a customer or sold to a purchasing party. The party receiving the wafers can perform some function not entrusted to the BEOL fabricator 106 and/or fabrication facility 132, such as testing the wafer for good die 173, singulating die 173 from the wafer, packaging good die 179, and testing packaged die 181 (see FIG. 9). In some applications, the BEOL fabricator 106 and/or fabrication facility 132 will perform the aforementioned processes and the NO branch at the stage 1163 will be taken because those processes are part of the BEOL process 1150 and are not post BEOL processes 1104.

The processing 1100 and 1150 allows for great flexibility in meeting the $1^{st}$ Cost, $1^{st}$ CPW, $2^{nd}$ Cost, and $2^{nd}$ CPW. For example, fabricator 102 and/or fabrication facility 130 can send FEOL wafers to third parties whose fabrication technology and CPW meet the requirements of stages 1101 and 1103. For example, a third party can have deposition equipment that is more fully depreciated than that of fabricator 102 and/or fabrication facility 130 so that it makes prudent financial sense to send FEOL wafers to the third party for some or all of the FEOL depositions steps in order to contain fabrication costs within the goals for the $1^{st}$ Cost and the $1^{st}$ CPW. As another example, BEOL fabricator 106 and/or fabrication facility 132 may lack one or more pieces of leading edge BEOL memory fabrication equipment necessary to complete the BEOL process 1150 (e.g., a plasma etching system) and one or more third party fabricators have the need equipment. Consequently, BEOL fabricator 106 and/or fabrication facility 132 contracts out that portion of the process 1150 to the third party (e.g., to perform the plasma etching portion of the process 1150).

The flexibility in structuring the costs for the FEOL processing and the BEOL processing also allows those costs to be apportioned according to the needs of the manufacturing entities. As one example, because the leading-edge BEOL fabrication technology can be considerably more expensive than the FEOL fabrication technology, a cost differential between the FEOL costs and the BEOL costs can be capped at a predetermined level, such as in a range of from about 30% to about 50%. Therefore, the manufacturing entity or entities can structure the cost differential such that the extra or additional cost for the BEOL technology is no greater than 30% more of the FEOL costs.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A method for device fabrication, comprising:
   providing a base wafer as part of a front-end-of-the-line (FEOL) circuitry fabrication process;
   forming active circuitry on a plurality of FEOL circuitry die on the base wafer, the FEOL circuitry fabrication process operative to configure each FEOL circuitry die for subsequent electrical coupling with one or more layers of memory to be fabricated directly above each FEOL circuitry die;
   forming the one or more layers of memory directly on top of each FEOL circuitry die using a back-end-of-the-line (BEOL) memory fabrication process, the forming including electrically coupling a portion of the active circuitry in each FEOL circuitry die with the one or more layers of memory that are formed directly above each FEOL circuitry die.

2. The method of claim 1, wherein fully depreciated capital assets are used for the FEOL circuitry fabrication process.

3. The method of claim 1, wherein substantially depreciated capital assets are used for the FEOL circuitry fabrication process.

4. The method of claim 1, wherein capital assets having substantially no depreciation are used for the BEOL memory fabrication process.

5. The method of claim 1, wherein the FEOL circuitry fabrication process further includes forming a shield layer on the base wafer operative to protect the base wafer during transportation of the base wafer, and
   wherein the BEOL memory fabrication process further includes removing the shield layer prior to the forming the one or more layers of memory.

6. The method of claim 1, wherein the FEOL circuitry fabrication process comprises a trailing edge technology selected to provide a first investment cost that is substantially less in cost than a second investment cost for the BEOL memory fabrication process.

7. The method of claim 1, wherein the FEOL circuitry fabrication process has a first cost per wafer and the BEOL memory fabrication process has a second cost per wafer that is greater than the first cost per wafer and the second cost per wafer is approximately one-half of a total fabrication cost or more.

8. The method of claim 1, wherein at least one of the one or more layers of memory includes a memory array.

9. The method of claim 8, wherein the memory array includes an embedded non-volatile memory.

10. The method of claim 8, wherein the memory array includes non-volatile memory.

11. The method of claim 8, wherein the memory array comprises a two-terminal cross-point array.

12. The method of claim 8, wherein the memory array includes a plurality of memory cells, each memory cell having exactly two terminals.

13. The method of claim 1, wherein at least one of the one or more layers of memory includes at least one embedded non-volatile memory.

14. The method of claim 1, wherein the portion of the active circuitry in each FEOL circuitry die is configured for data operations on the one or more layers of memory that are formed directly above each FEOL circuitry die.

15. The method of claim 1, wherein the FEOL circuitry fabrication process occurs at a first fabrication facility and the BEOL memory fabrication process occur at a second fabrication facility.

16. The method of claim 15 and further comprising:
   transporting the base wafer from the first fabrication facility to the second fabrication facility.

17. A method for device fabrication, comprising:
   forming a first part of an integrated circuit (IC) at a first fabrication facility, the IC initially comprises a front-end-of-the-line (FEOL) circuitry die formed on a base wafer using a FEOL circuitry fabrication process; and
   forming a second part of the IC at a second fabrication facility, the second part comprises one or more layers of memory that are directly fabricated above each FEOL circuitry die using a back-end-of-the-line (BEOL) memory fabrication process,
   wherein after the forming of the first part and the second part, the IC comprises a unitary die including a base layer with active circuitry fabricated thereon and the one or more layers of memory in contact with and positioned above the base layer and electrically coupled with at least a portion of the active circuitry.

18. The method of claim 17, wherein fully depreciated capital assets are used for the FEOL circuitry fabrication process.

19. The method of claim 17, wherein substantially depreciated capital assets are used for the FEOL circuitry fabrication process.

20. The method of claim 17, wherein capital assets having substantially no depreciation are used for the BEOL memory fabrication process.

21. The method of claim 17, wherein a first investment cost for the FEOL circuitry fabrication process is substantially less than a second investment cost for the BEOL memory fabrication process.

22. A method for device fabrication, comprising:
   forming a first part of an integrated circuit (IC) that initially comprises a front-end-of-the-line (FEOL) circuitry die formed on a base wafer using a FEOL circuitry fabrication process; and
   forming a second part of the IC, the second part comprises one or more layers of memory that are directly fabricated above the FEOL circuitry die using a back-end-of-the-line (BEOL) memory fabrication process,
   wherein after the forming of the first part and the second part, the IC comprises a unitary die including a base layer having active circuitry fabricated thereon and the one or more layers of memory fabricated directly above and in contact with the base layer and electrically coupled with at least a portion of the active circuitry.

23. The method of claim 22, wherein at least one of the one or more layers of memory includes non-volatile memory.

24. The method of claim 23, wherein the non-volatile memory is configured in a memory array.

25. The method of claim 23, wherein the non-volatile memory includes a plurality of memory cells, each memory cell having exactly two terminals.

* * * * *